(12) United States Patent
Jang et al.

(10) Patent No.: US 11,990,361 B2
(45) Date of Patent: May 21, 2024

(54) ELECTROSTATIC CHUCK, ETCHING APPARATUS, AND METHOD OF MANUFACTURING DISPLAY DEVICE

(71) Applicant: Samsung Display Co., LTD., Yongin-si (KR)

(72) Inventors: Hee Sun Jang, Incheon (KR); Tae Hun Kim, Suwon-si (KR); Do Hwan Kim, Seoul (KR); Jae Han Kim, Seoul (KR); Seung Ho Myoung, Hwaseong-si (KR); Dae Young Oh, Hwaseong-si (KR); Gyeong Hee Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 216 days.

(21) Appl. No.: 17/365,990

(22) Filed: Jul. 1, 2021

(65) Prior Publication Data
US 2022/0037186 A1     Feb. 3, 2022

(30) Foreign Application Priority Data

Jul. 31, 2020  (KR) .................. 10-2020-0095875

(51) Int. Cl.
| | | |
|---|---|---|
| *H01L 21/683* | (2006.01) | |
| *H10K 71/00* | (2023.01) | |
| *H10K 50/11* | (2023.01) | |
| *H10K 50/844* | (2023.01) | |
| *H10K 59/12* | (2023.01) | |

(52) U.S. Cl.
CPC ........ *H01L 21/6833* (2013.01); *H10K 71/00* (2023.02); *H10K 50/11* (2023.02); *H10K 50/844* (2023.02); *H10K 59/12* (2023.02); *H10K 59/1201* (2023.02)

(58) Field of Classification Search
None
See application file for complete search history.

(56) References Cited

FOREIGN PATENT DOCUMENTS

| | | | |
|---|---|---|---|
| KR | 20020042483 A | * | 6/2002 |
| KR | 2004-0026266 | | 3/2004 |
| KR | 10-0449919 | | 9/2004 |
| KR | 10-1647499 | | 8/2016 |
| KR | 10-1761585 | | 7/2017 |
| KR | 2018-0010376 | | 1/2018 |
| KR | 10-1906288 | | 12/2018 |

\* cited by examiner

*Primary Examiner* — Michael Lebentritt
(74) *Attorney, Agent, or Firm* — KILE PARK REED & HOUTTEMAN PLLC

(57) ABSTRACT

The chuck for supporting a target substrate for a display device, the chuck includes: a base having a first surface to support an object and a second surface opposite the first surface, the first surface including a first area and a second area; and indentations formed in the second area and recessed from the first area in a thickness direction of the base. The indentations include a first indentation extending in a first direction and a second indentation extending in a second direction intersecting the first direction.

16 Claims, 20 Drawing Sheets

ELECTROSTATIC CHUCK, ETCHING APPARATUS, AND METHOD OF MANUFACTURING DISPLAY DEVICE

This application claims priority from and the benefit of Korean Patent Application No. 10-2020-0095875, filed on Jul. 31, 2020, which is hereby incorporated by reference for all purposes as if fully set forth herein.

BACKGROUND

Field

Embodiments of the invention relate generally to a display device, and more specifically, to an electrostatic chuck, an etching apparatus, and a method of manufacturing a display device.

Discussion of the Background

With the rapid development of information and communication technology and the expansion of the market, flat panel displays are in the spotlight as display devices.

Examples of such flat panel displays include liquid crystal displays (LCDs), plasma display panels (PDPs), and organic light emitting diode (OLED) displays. Among them, OLED displays are in the spotlight as next-generation display devices due to very good advantages such as fast response speed, lower power consumption than conventional LCDs, light weight, the ability to be made ultra-thin because no separate backlight device is required, and high luminance.

An OLED display may be manufactured through a pattern formation process, an organic thin-film deposition process, an etching process, an encapsulation process, and a bonding process for bonding a substrate on which an organic thin film is deposited and a substrate that has been encapsulated. Of these various processes, the etching process is a process of obtaining a desired shape by etching away an unnecessary part from a surface of a substrate.

The above information disclosed in this Background section is only for understanding of the background of the inventive concepts, and, therefore, it may contain information that does not constitute prior art.

SUMMARY

Applicant discovered that laser beams used in etching processes during the manufacture of a substrate of a display device may cause damage to the substrate.

Chucks constructed according to the principles and embodiments of the invention are capable of reducing damage caused by a laser beam, e.g., by forming a recess that may be in the form of a groove in an area corresponding to a processing area of a target substrate. More specifically, the groove may be formed on a lower surface of the chuck overlapping the processing area of the target substrate to form a space between the lower surface of the chuck and the processing area of the target substrate. Therefore, the laser beam passing through the target substrate may be reduced in energy while travelling through the space, e.g., the groove, before reaching the lower surface of the chuck. Accordingly, the laser beam with the reduced energy may reach the lower surface of the chuck, or the laser beam may fail to reach the lower surface of the chuck due to exhaustion of its energy. This reduction in energy may reduce damage to the lower surface of the chuck caused by the laser beam, thereby preventing particles from peeling off the chuck on a surface of the target substrate.

Etching apparatus including chucks constructed according to the principles and embodiments of the invention are capable of reducing damage to a lower surface of an electrostatic chuck by a laser beam.

Etching apparatus including chucks constructed according to the principles and embodiments of the invention are capable of improving efficiency of an etching process by reducing the replacement time of the chuck even when the etching process is performed on a plurality of target substrates. For example, a plurality of holes or a plurality of grooves extending in one direction are formed on the lower surface of the electrostatic chuck of the etching apparatus. Therefore, even when an etching process is performed on various target substrates, the chuck may not be replaced. Accordingly, the replacement time of the chuck may be reduced, thereby improving the efficiency of the etching process.

Methods of manufacturing a display device according to the principles and embodiments of the invention are capable of improving reliability of etching process of the display device since the lower surface of the chuck is prevented from being damaged by the laser beam.

Additional features of the inventive concepts will be set forth in the description which follows, and in part will be apparent from the description, or may be learned by practice of the inventive concepts.

According to one aspect of the invention, a chuck for supporting a target substrate for a display device, the chuck includes: a base having a first surface to support an object and a second surface opposite the first surface, the first surface including a first area and a second area; and indentations formed in the second area and recessed from the first area in a thickness direction of the base. The indentations include a first indentation extending in a first direction and a second indentation extending in a second direction intersecting the first direction.

The first indentation may include a plurality of first grooves along the second direction, and the second indentation may include a plurality of second grooves along the first direction.

A first distance between the first grooves disposed adjacent to each other in the second direction may be greater than a first width of each first groove in the second direction, and a second distance between the second grooves disposed adjacent to each other in the first direction may be greater than a second width of each second groove in the first direction.

The first distance between the first grooves may be different from the second distance between the second grooves.

The chuck may include an electrostatic chuck and the base may include a base substrate including a flat area and an indentation area having third indentation corresponding to the indentations formed in the second area, a first dielectric layer disposed on one surface of the base substrate, an electrode layer disposed on the first dielectric layer; and a second dielectric layer disposed on the electrode layer.

The first dielectric layer, the electrode layer, and the second dielectric layer may expose at least a part of the one surface of the base substrate in the indentation area.

The electrode layer may include a first electrode and a second electrode spaced apart from the first electrode. The first electrode and the second electrode may be electrically insulated from each other.

According to another aspect of the invention, an etching apparatus for making a substrate of a display device, the apparatus includes: a vacuum chamber in which an etching process is performed on a target substrate having at least one processing area; a chuck disposed inside the vacuum chamber to support and fix the target substrate onto a first surface thereof; and a laser module disposed outside the vacuum chamber to irradiate a laser beam onto the processing area of the target substrate. The first surface of the chuck includes a first area and a second area having indentations recessed in a thickness direction of the chuck, and at least a part of the indentations overlaps the processing area of the target substrate.

The target substrate may contact the first area of the chuck and may be spaced apart from the second area in areas where the indentations are disposed.

The chuck may include an electrostatic chuck including a base substrate including a flat area and an indentation area having third indentations corresponding to the indentations formed in the second area; a first dielectric layer disposed on a surface of the base substrate; an electrode layer disposed on the first dielectric layer; and a second dielectric layer disposed on the electrode layer.

The first dielectric layer, the electrode layer, and the second dielectric layer may expose at least a part of the one surface of the base substrate in the indentation area.

The electrode layer may include a first electrode and a second electrode spaced apart from the first electrode. The first electrode and the second electrode may be electrically insulated from each other.

The target substrate may include a plurality of unit cells, and each of the unit cells may include at least one processing area.

The indentations may include grooves formed in a generally lattice shape.

The grooves may include a first groove extending in a first direction and a second groove extending in a second direction intersecting the first direction.

The first groove may include a plurality of first grooves along the second direction, the second groove may include a plurality of second groove along the first direction, and a first distance between the first grooves disposed adjacent to each other in the second direction may be greater than a first width of each first groove in the second direction, and a second distance between the second grooves disposed adjacent to each other in the first direction may be greater than a second width of each second groove in the first direction.

The grooves may include a plurality of first grooves arranged along a first direction and spaced apart from each other and a plurality of second grooves arranged along a second direction intersecting the first direction and spaced apart from each other.

A width of each groove may be greater than a width of the processing area.

According to still another aspect of the invention, a method of manufacturing a display device includes the steps of: mounting a target substrate including a processing area on a first surface of a chuck, the first surface having a plurality of indentations, with at least a part of the indentations overlapping the processing area of the target substrate in a thickness direction of the chuck; and etching the target substrate by irradiating a laser beam emitted from a laser module spaced apart from the chuck to the processing area of the target substrate.

The step of etching the target substrate may include the step of forming a hole to penetrate a part of the target substrate.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
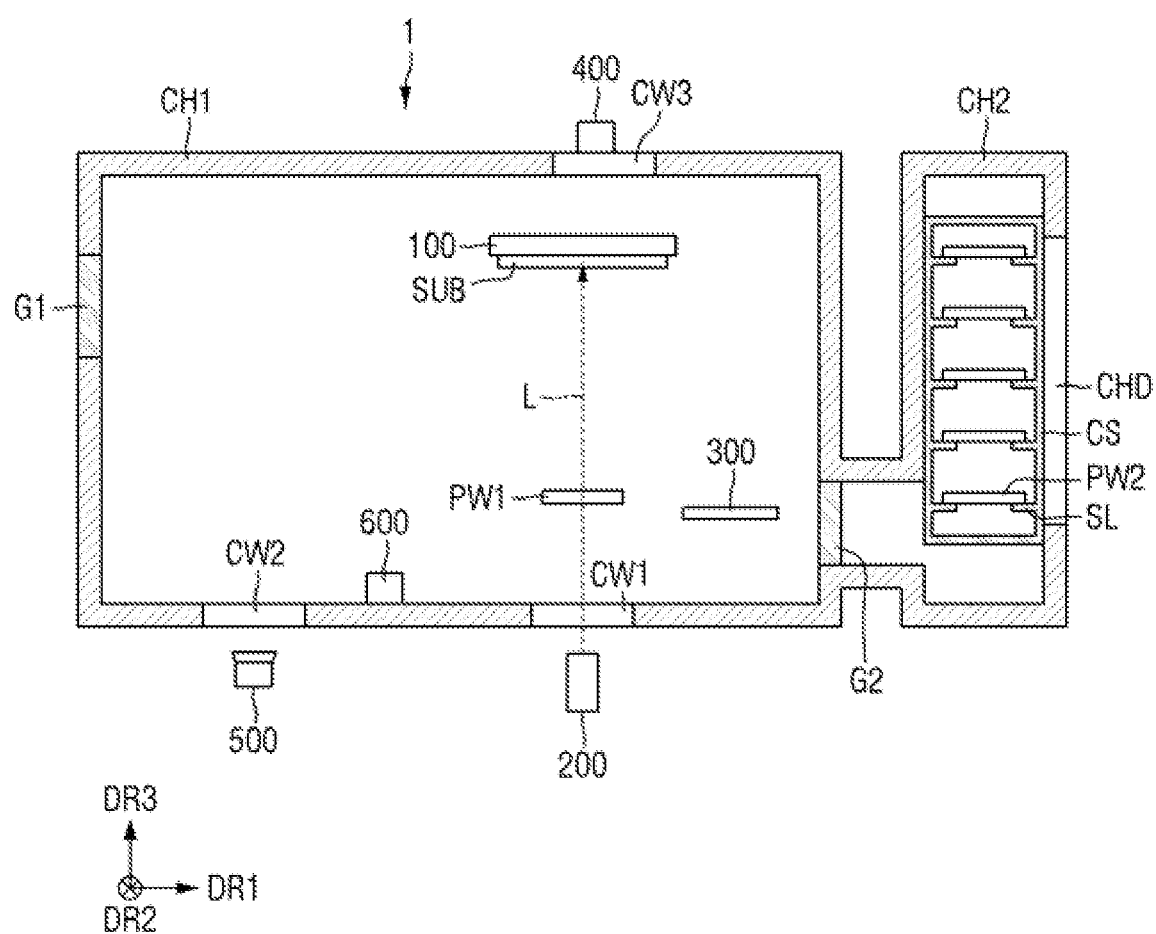
FIG. 1 is a partially cut away side view of an embodiment of an etching apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a partially cut away side view of an embodiment of an etching apparatus 1 constructed according to the principles of the invention.

In the drawings for describing the etching apparatus 1 in this specification, a first direction DR1, a second direction DR2, and a third direction DR3 are defined. The third direction DR3 indicates a thickness direction of a first vacuum chamber CH1. The first direction DR1 and the second direction DR2 perpendicularly intersect each other, and the third direction DR3 is a direction intersecting a plane in which the first direction DR1 and the second direction DR2 lie, that is, perpendicularly intersects both the first direction DR1 and the second direction DR2.

In embodiments, unless otherwise stated, "above" indicates a side of the third direction DR3, i.e., a side of a target substrate SUB on which a chuck, which may be in the form of an electrostatic chuck unit 100, is located, and an "upper surface" indicates a surface facing the side of the third direction DR3. In addition, "below" indicates the other side opposite the side of the third direction DR3, i.e., a side located opposite the side of the target substrate SUB on which the electrostatic chuck unit 100 is located, and a "lower surface" indicates a surface facing the other side of the third direction DR3.

Referring to FIG. 1, the etching apparatus 1 may include the first vacuum chamber CH1, the electrostatic chuck unit 100, a laser module 200, and first through third chamber windows CW1 through CW3. The etching apparatus 1 may further include a second vacuum chamber CH2, a transfer unit 300, first and second protective windows PW1 and PW2, and a cassette CS.

The target substrate SUB described herein is an object to be processed by the etching apparatus 1 and is applicable to any type of display device such as an organic light emitting display device using an organic light emitting diode including an organic light emitting layer, a micro-light emitting diode (LED) display device using a micro-LED, a quantum dot light emitting display device using a quantum dot LED including a quantum dot light emitting layer, or an inorganic light emitting display device using an inorganic light emitting element including an inorganic semiconductor. In the following description, the target substrate SUB will be mainly described as a substrate (or a display panel) of an organic light emitting display device for descriptive convenience.

In FIG. 1, a part of the first vacuum chamber CH1 is schematically illustrated. The etching apparatus 1 may include a vacuum pump and a vacuum valve, and the first vacuum chamber CH1 may be maintained in a vacuum by the vacuum pump and the vacuum valve.

The first vacuum chamber CH1 may provide a space in which an etching process of the target substrate SUB is performed. The target substrate SUB may be provided from the outside of the first vacuum chamber CH1 to the inside of the first vacuum chamber CH1 and placed in the first vacuum chamber CH1.

A first gate valve G1 may be disposed on a side of the first vacuum chamber CH1. The target substrate SUB may be supplied into the first vacuum chamber CH1 through the first gate valve G1. That is, the first gate valve G1 may provide a passage through which the target substrate SUB can enter or exit the first vacuum chamber CH1.

A second gate valve G2 may be disposed on the other side of the first vacuum chamber CH1. The protective windows PW1 and PW2 to be described later may be transferred through the second gate valve G2.

The electrostatic chuck unit 100 may be disposed in the first vacuum chamber CH1. The electrostatic chuck unit 100 may move or fix the target substrate SUB by supporting the target substrate SUB. The electrostatic chuck unit 100 may fix the target substrate SUB, which is supplied into the first vacuum chamber CH1, onto a surface of the electrostatic chuck unit 100 using electrostatic force. In an embodiment, the electrostatic chuck unit 100 may be configured as an electrostatic chuck that fixes the target substrate SUB using electrostatic force. The electrostatic chuck unit 100 may be disposed in an upper part of the first vacuum chamber CH1, and a lower surface of the electrostatic chuck unit 100 and an upper surface of the target substrate SUB may contact each other.

The laser module 200 may be disposed outside the first vacuum chamber CH1. The laser module 200 may overlap a process area where the etching process of the target substrate SUB is performed in the first vacuum chamber CH1. However, the embodiments are not limited thereto, and the laser module 200 may also not overlap the process area were the etching process is performed.

The laser module 200 irradiates a laser beam L onto a surface (e.g., a lower surface) of the target substrate SUB to process the target substrate SUB. The laser beam L emitted from the laser module 200 may pass through the first chamber window CW1 disposed in the first vacuum chamber CH1 and reach the target substrate SUB, thereby etching the target substrate SUB. The laser module 200 may include a laser unit, a lens, a mirror, a beam expander, a filter, or a scanner.

The first chamber window CW1 may be disposed on a bottom surface of the first vacuum chamber CH1. The first chamber window CW1 may overlap the process area of the first vacuum chamber CH1.

The first chamber window CW1 may be made of a transparent material that can transmit the laser beam L emitted from the laser module 200. The laser beam L emitted from the laser module 200 disposed outside the first vacuum chamber CH1 may enter the first vacuum chamber CH1 through the first chamber window CW1.

The first chamber window CW1 may be disposed between the laser module 200 and the electrostatic chuck unit 100 (or the target substrate SUB). That is, the first chamber window CW1 may overlap the laser module 200 and the electrostatic chuck unit 100 (or the target substrate SUB) in the thickness direction.

The first chamber window CW1 may be made of a quartz material. Although the first chamber window CW1 is shown as one window in FIG. 1, the embodiments are not limited thereto. That is, the first chamber window CW1 may also be composed of a plurality of windows according to the number of laser units included in the laser module 200.

The first chamber window CW1 may have a generally quadrangular planar shape. Alternatively, the first chamber window CW1 may have a generally circular planar shape, but the embodiments are not limited thereto.

The first protective window PW1 may be disposed between the first chamber window CW1 and the electrostatic chuck unit 100 in the first vacuum chamber CH1. In an embodiment, the first protective window PW1 may be disposed above the first chamber window CW1. The first protective window PW1 may overlap the process area where the etching process of the target substrate SUB is performed in the first vacuum chamber CH1.

The first protective window PW1 may be made of a transparent material that can transmit the laser beam L entering the first vacuum chamber CH1 through the first chamber window CW1. The first protective window PW1 may be made of a quartz material and may be made of the same material as the first chamber window CW1.

Figure 5:
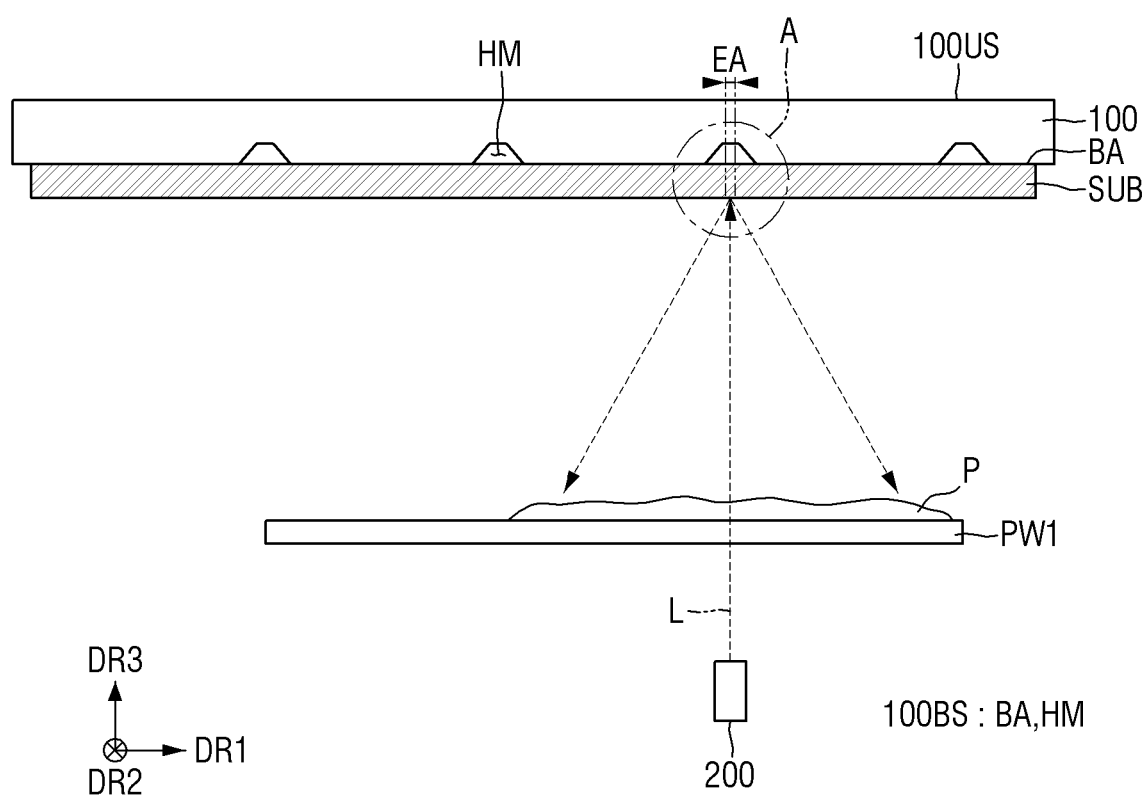
FIG. 5 is an enlarged view illustrating a process of etching a target substrate using the etching apparatus of FIG. 1.

The first protective window PW1 may transmit the laser beam L while preventing the first chamber window CW1 from being contaminated by particles P shown in FIG. 5 peeling off and falling from the target substrate SUB as the etching process is performed. Accordingly, it is possible to prevent a reduction in refraction or transmittance due to the particles P on the first chamber window CW1, thereby improving processing quality.

Although the first protective window PW1 is shown as one window in FIG. 1, the embodiments are not limited thereto. That is, the first protective window PW1 may also be composed of a plurality of windows according to the number of laser modules 200. The first protective window PW1 may have a generally quadrangular or generally circular planar shape. In addition, the planar shape of the first protective window PW1 may follow the planar shape of the first chamber window CW1, but the embodiments are not limited thereto.

A laser power measurement unit 400 may be disposed on the first vacuum chamber CH1. The laser power measurement unit 400 may measure the power of the laser beam L emitted from the laser module 200. For example, the laser power measurement unit 400 may include laser power meters that receive the laser beam L emitted from the laser module 200 and transmitted through the first chamber window CW1 and the third chamber window CW3, convert the laser beam L into an electrical signal, and display the electrical signal.

The laser power measurement unit 400 may overlap the process area where the etching process of the target substrate SUB is performed in the first vacuum chamber CH1. In addition, the laser power measurement unit 400 may overlap the first protective window PW1. Although the laser power measurement unit 400 is disposed outside the first vacuum chamber CH1 in FIG. 1, it may be located at any position as long as it can detect the power of the laser beam L emitted from the laser module 200.

An alignment inspection unit 500 may be disposed outside the first vacuum chamber CH1. The alignment inspection unit 500 may be disposed under the first vacuum chamber CH1. The alignment inspection unit 500 may inspect the alignment of the electrostatic chuck unit 100 and the target substrate SUB by photographing the electrostatic chuck unit 100 and the target substrate SUB through the second chamber window CW2. In an embodiment, the alignment inspection unit 500 may include a camera. The alignment inspection unit 500 may detect whether the electrostatic chuck unit 100 and the target substrate SUB are misaligned by photographing whether a groove HM shown in FIG. 2 of the electrostatic chuck unit 100 which will be described later overlaps a processing area EA of the target substrate SUB in the thickness direction (DR3).

The transfer unit 300 may be disposed in the first vacuum chamber CH1. The transfer unit 300 may reciprocate in the first vacuum chamber CH1 to partially overlap the process area where the etching process of the target substrate SUB is performed. The transfer unit 300 may be connected to an external driving source to reciprocate left and right within the first vacuum chamber CH1.

The transfer unit 300 may transfer the first protective window PW1 described above and the second protective windows PW2 to be described later. The first and second protective windows PW1 and PW2 may be transferred from the first vacuum chamber CH1 to the second vacuum chamber CH2 or from the second vacuum chamber CH2 to the first vacuum chamber CH1 by the transfer unit 300.

The second vacuum chamber CH2 may be a space in which the second protective windows PW2 are stored. In FIG. 1, a part of the second vacuum chamber CH2 is schematically illustrated. The second vacuum chamber CH2 may be maintained in a vacuum by the vacuum pump and the vacuum valve. The second vacuum chamber CH2 may be in any shape as long as it can store the second protective windows PW2.

A chamber door CHD may be disposed on a side of the second vacuum chamber CH2. For example, contaminated protective windows PW1 and PW2 may be cleaned or replaced with new protective windows through the chamber door CHD. That is, a stock of the protective windows PW1 and PW2 may be managed separately from the first vacuum chamber CH1.

The cassette CS may be disposed in the second vacuum chamber CH2. The cassette CS may be fixed in the second vacuum chamber CH2. In addition, the cassette CS may be raised or lowered by a separate lifting unit and may be carried into or out of the second vacuum chamber CH2. The cassette CS may include a plurality of supports and a plurality of slots SL protruding from the supports.

The slots SL may be located to face each other. The slots SL may support the second protective windows PW2 and provide spaces in which the second protective windows PW2 can be loaded. Although the cassette CS includes a total of five pairs of slots SL in FIG. 1, the number of slots SL of the cassette CS is not limited thereto.

The second protective windows PW2 may be located in the second vacuum chamber CH2. Specifically, the second protective windows PW2 may be loaded on the slots SL of the cassette CS.

Each of the second protective windows PW2 is a protective window for replacement and may replace the first protective window PW1 when the first protective window PW1 is contaminated. Accordingly, it is possible to prevent a reduction in refraction or transmittance due to the particles P on the first protective window PW1, thereby improving processing quality. In addition, since a process of replacing or cleaning the first protective window PW1 by opening the first vacuum chamber CH1 is unnecessary, the process efficiency of the etching apparatus 1 can be increased.

The second vacuum chamber CH2 may be maintained in a vacuum by the vacuum pump and the vacuum valve even when the protective windows PW1 and PW2 are replaced. Therefore, even if the second gate valve G2 is opened to transfer a second protective window PW2, the degree of vacuum of the first vacuum chamber CH1 may not be affected. That is, when the first protective window PW1 is contaminated, it is possible to replace the first protective window PW1 with a second protective window PW2 while maintaining a high-vacuum environment of the first vacuum chamber CH1. Accordingly, the etching process can be continuously performed in the high-vacuum environment without opening the chamber.

Furthermore, since the etching process can be performed in the high-vacuum environment, the permeation of moisture or oxygen into a light emitting element layer EML (see FIG. 7) included in the target substrate SUB can be minimized. Therefore, the element reliability of the target substrate SUB, that is, a display device to be described later can be improved.

The second protective windows PW2 may be made of the same material as the first protective window PW1. That is, the second protective windows PW2 may be made of a transparent material that can transmit the laser beam L. The second protective windows PW2 may be made of a quartz material.

The second protective windows PW2 may have substantially the same planar shape as the first protective window PW1. That is, the second protective windows PW2 may have a generally quadrangular or generally circular shape.

Although five second protective windows PW2 are stored in the second vacuum chamber CH2 in FIG. 1, the number of second protective windows PW2 is not limited thereto. That is, the stock management of the second protective windows PW2 may vary depending on the laser processing time, the number of laser processing processes, and the contamination cycle of protective windows.

Figure 2:
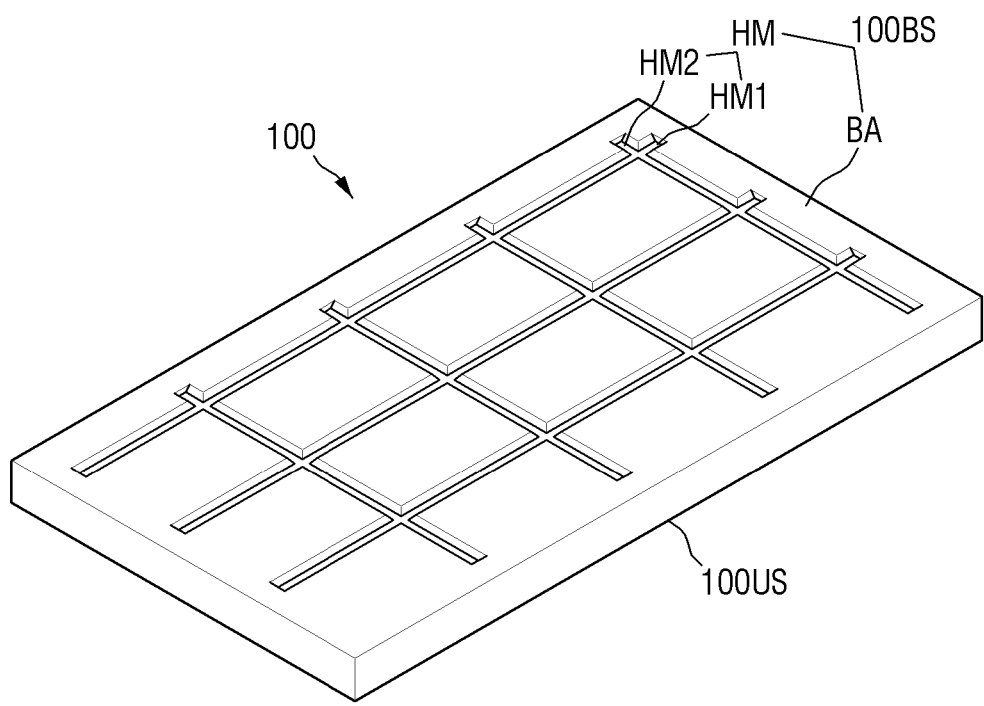
FIG. 2 is a schematic perspective view of an embodiment of the electrostatic chuck unit shown in FIG. 1.
Figure 3:
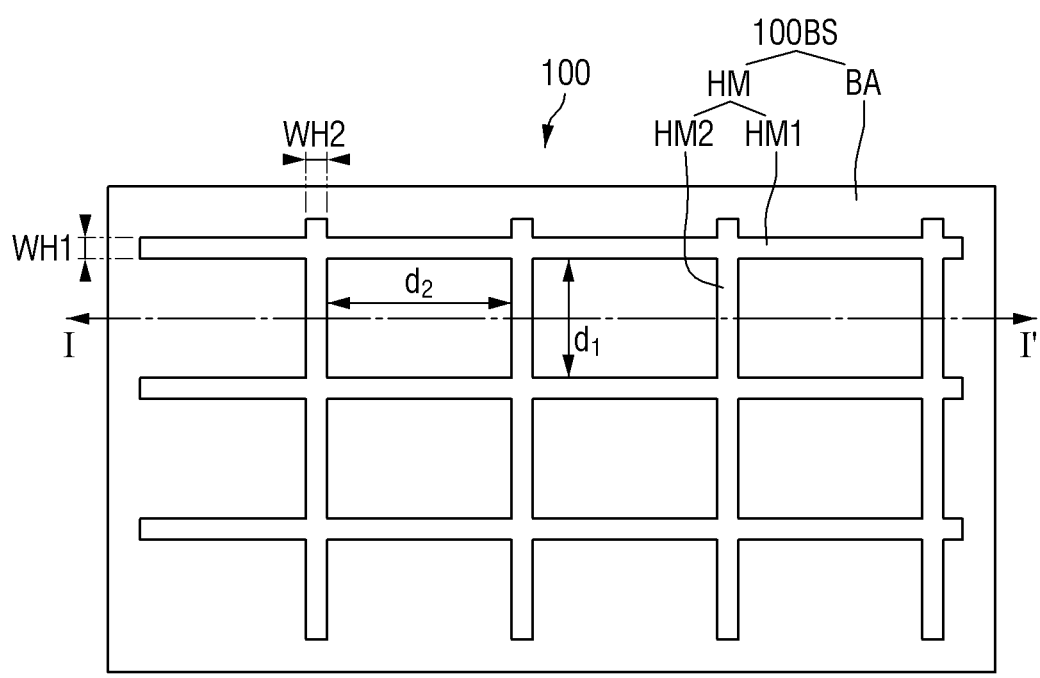
FIG. 3 is a bottom view of the electrostatic chuck unit of FIG. 2.
Figure 3:
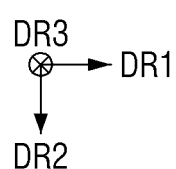
Figure 4:
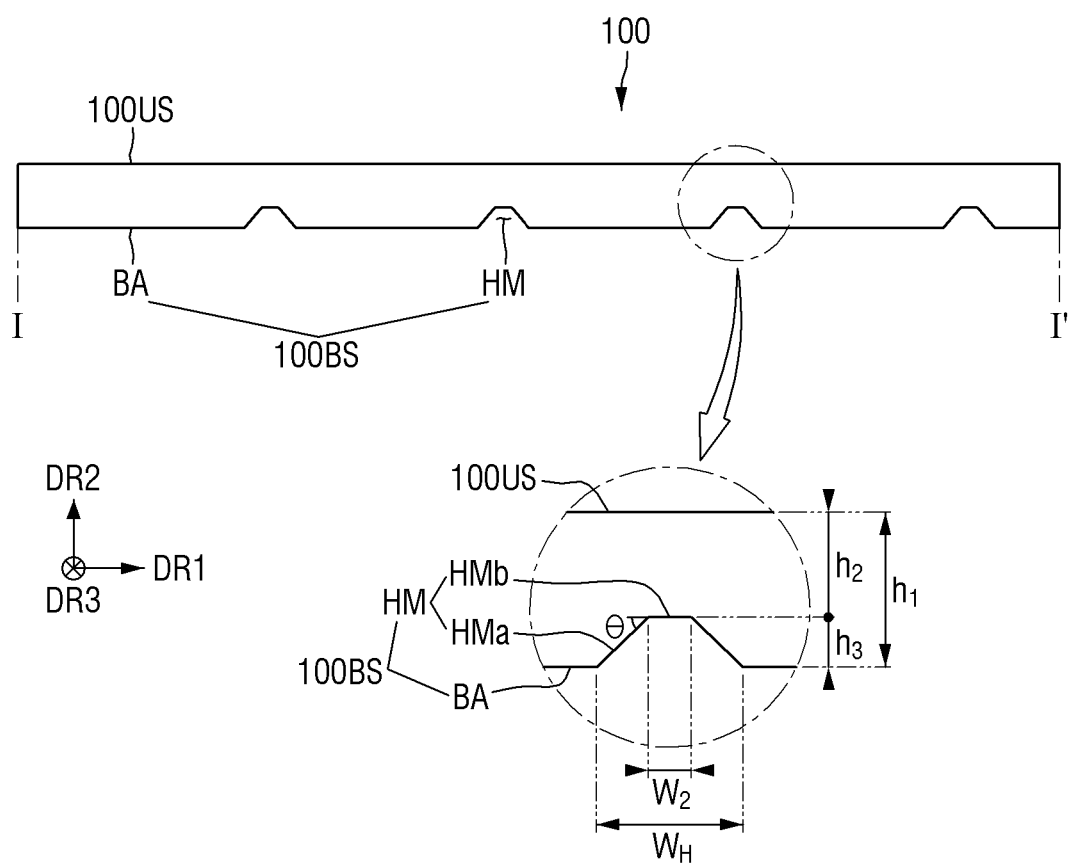
FIG. 4 is a cross-sectional view of the electrostatic chuck unit taken along line I-I' of FIG. 3.

FIG. 2 is a schematic perspective view of an embodiment of the electrostatic chuck unit 100 shown in FIG. 1. FIG. 3 is a bottom view of the electrostatic chuck unit 100 of FIG. 2. FIG. 4 is a cross-sectional view of the electrostatic chuck unit 100 taken along line I-I' of FIG. 3. It should be noted that FIGS. 2 and 3 are bottom views of the electrostatic chuck unit 100 as seen from under the electrostatic chuck unit 100.

Referring to FIGS. 2 through 4, the electrostatic chuck unit 100 may have a generally rectangular shape including long sides and short sides, that is, may be longer in the first direction DR1 than in the second direction DR2 in plan view. However, the embodiments are not limited thereto, and the planar shape of the electrostatic chuck unit 100 can be changed variously. The electrostatic chuck unit 100 may move the target substrate SUB supplied into the first vacuum chamber CH1 by supporting the target substrate SUB through electrostatic or other known forces.

The electrostatic chuck unit 100 may include a base having an upper surface 100US and a lower surface 100BS facing the upper surface 100US. The upper surface 100US of the electrostatic chuck unit 100 may be a surface disposed on a side of the third direction DR3 which is the thickness direction of the etching apparatus 1, and the lower surface 100BS of the electrostatic chuck unit 100 may be a surface disposed in an opposite direction, that is, disposed on the other side opposite the above side of the third direction DR3 which is the thickness direction of the etching apparatus 1. The target substrate SUB may be mounted on the lower surface 100BS of the electrostatic chuck unit 100. Specifically, the lower surface 100B S of the electrostatic chuck unit 100 and the upper surface of the target substrate SUB may contact each other.

The upper surface 100US of the electrostatic chuck unit 100 may be formed substantially flat. That is, the upper surface 100US of the electrostatic chuck unit 100 may be located substantially in one plane.

The lower surface 100BS of the electrostatic chuck unit 100 may include a base area BA and indentations, which may be in the form of grooves, slits, slots, openings, recesses, or the like (collectively referred to herein as "grooves") HM.

The grooves HM may be recessed from the base area BA in the thickness direction (i.e., the third direction DR3). For example, referring to FIG. 4, the cross-sectional shape of each of the grooves HM may be a generally trapezoidal shape whose width decreases in the thickness direction (or a depth direction, the third direction DR3). However, the embodiments are not limited thereto, and the cross-sectional shape of each of the grooves HM may also be a generally hemispherical or other shape whose width decreases in the thickness direction (or the depth direction, the third direction DR3).

Referring to FIGS. 2 and 3, the grooves HM may include a plurality of first grooves HM1 extending in the first direction DR1 in plan view and a plurality of second grooves HM2 extending in the second direction DR2 intersecting the first direction DR1. That is, the grooves HM may be formed in a lattice shape in plan view. The first grooves HM1 and the second grooves HM2 may intersect each other, and the intersecting areas of the first and second grooves HM1 and HM2 may be integrated to form one groove HM.

The first grooves HM1 may extend in the first direction DR1 in plan view and may be spaced apart from each other in the second direction DR2. For example, the direction in which the first grooves HM1 extend may be substantially parallel to the direction in which the long sides of the electrostatic chuck unit 100 extend. However, the embodiments are not limited thereto, and as shown in FIG. 4, the extending direction of the first grooves HM1 may also be inclined at a predetermined angle to the extending direction of the long sides of the electrostatic chuck unit 100.

Referring to FIG. 3, widths WH1 of the first grooves HM1 in the second direction DR2 may be substantially equal. In an embodiment, the maximum width WH1 of each first groove HM1 in the second direction DR2 may be in the range of about 20 to 30 mm. However, the embodiments are not limited thereto, and the widths WH1 of the first grooves HM1 in the second direction DR2 may also be different from each other.

Distances between adjacent first grooves HM1 may be substantially equal. Specifically, distances d1 between the first grooves HM1 disposed adjacent to each other in the second direction DR2 may be substantially equal. Each distance d1 between the first grooves HM1 may be a distance in the second direction DR2 between adjacent first grooves HM1. Although the distances d1 between the first grooves HM1 are substantially equal in FIG. 3, the embodiments are not limited thereto. The distances d1 between the first grooves HM1 disposed adjacent to each other in the second direction DR2 may also be different from each other. The distances d1 between the first grooves HM1 may vary according to the design of at least one processing area EA included in the target substrate SUB to be described later.

The distances d1 between the first grooves HM1 in the second direction DR2 may be greater than the widths WH1 of the first grooves HM1 in the second direction DR2. Since the widths WH1 of the first grooves HM1 in the second direction DR2 are smaller than the distances d1 between the first grooves HM1 in the second direction DR2, an area of contact between the electrostatic chuck unit 100 and the target substrate SUB increases, thereby preventing the function of the electrostatic chuck unit 100 to support the target substrate SUB from being undermined by the formation of the first grooves HM1.

The second grooves HM2 may extend in the second direction DR2 in plan view and may be spaced apart from each other in the first direction DR1. For example, the direction in which the second grooves HM2 extend may be substantially parallel to the direction in which the short sides of the electrostatic chuck unit 100 extend. However, the embodiments are not limited thereto, and the extending direction of the second grooves HM2 may also be inclined at a predetermined angle to the extending direction of the short sides of the electrostatic chuck unit 100.

Widths WH2 of the second grooves HM2 in the first direction DR1 may be substantially equal. In an embodiment, the maximum widths WH2 of the second grooves HM2 in the first direction DR1 may be in the range of about 20 to 30 mm. However, the embodiments are not limited thereto, and the widths WH2 of the second grooves HM2 in the first direction DR1 may also be different from each other.

The widths WH2 of the second grooves HM2 in the first direction DR1 may be substantially equal to the widths WH1 of the first grooves HM1 in the second direction DR2. That is, widths WH of the grooves HM may include the widths WH1 of the first grooves HM1 in the second direction DR2 and the widths WH2 of the second grooves HM2 in the first direction DR1, and the widths WH of the grooves HM may be substantially equal. In an embodiment, the maximum widths WH of the grooves HM may be in the range of about 20 to 30 mm. However, the embodiments are not limited thereto, and the widths WH2 of the second grooves HM2 in the first direction DR1 may also be different from the widths WH1 of the first grooves HM1 in the second direction DR2.

Distances between adjacent second grooves HM2 may be substantially equal. Specifically, distances d2 between the second grooves HM2 disposed adjacent to each other in the first direction DR1 may be substantially equal. Each distance d2 between the second grooves HM2 may be a distance in the first direction DR1 between adjacent second grooves HM2. Although the distances d2 between the second grooves HM2 are substantially equal in the drawings, the embodiments are not limited thereto. The distances d2 between two second grooves HM2 disposed adjacent to each other in the first direction DR1 may also be different from each other. The distances d2 between the second grooves HM2 may vary according to the design of a plurality of processing areas EA included in the target substrate SUB to be described later.

The distances d2 between the second grooves HM2 in the first direction DR1 may be greater than the widths WH2 of the second grooves HM2 in the first direction DR1. Since the distances d2 between the second grooves HM2 in the first direction DR1 are greater than the widths WH2 of the second grooves HM2 in the first direction DR1, the area of contact between the electrostatic chuck unit 100 and the target substrate SUB increases, thereby preventing the function of the electrostatic chuck unit 100 to support the target substrate SUB from being undermined by the formation of the second grooves HM2.

In an embodiment in which the planar shape of the electrostatic chuck unit 100 is generally rectangular including long sides in the first direction DR1 and short sides in the second direction DR2, the distances d2 between the second grooves HM2 in the first direction DR1 may be greater than the distances d1 between the first grooves HM1 in the second direction DR2. However, the embodiments are not limited thereto, and the distances d1 and d2 between the first and second grooves HM1 and HM2 may also be substantially equal.

Although three first grooves HM1 extending in the first direction DR1 and four second grooves HM2 extending in the second direction DR2 are illustrated in FIGS. 2 and 3, the number of first grooves HM1 and the number of second grooves HM2 are not limited thereto.

The base area BA may be an area excluding the grooves HM from the lower surface 100BS of the electrostatic chuck unit 100. The base area BA may be an area between the first grooves HM1 and the second grooves HM2. Some parts of the base area BA may include island shapes separated by the grooves HM.

The base area BA faces the upper surface 100US of the electrostatic chuck unit 100. The base area BA may be generally located substantially in one plane. The base area BA may contact the upper surface of the target substrate SUB and fix the target substrate SUB by supporting the target substrate SUB as described above.

The planar area of the base area BA may be larger than the planar area of the grooves HM as a whole. The planar area of the grooves HM may be about 30% or less of the area of the lower surface 100BS of the electrostatic chuck unit 100. The planar area of the base area BA may be about 70% or more of the area of the lower surface 100BS of the electrostatic chuck unit 100. Since the planar area of the base area BA, which is a part of the lower surface 100BS of the electrostatic chuck unit 100 contacting the target substrate SUB, is larger than the planar area of the grooves HM, it is possible to prevent the supporting function of the electrostatic chuck unit 100 from being undermined by a reduction in the contact area between the electrostatic chuck unit 100 and the target substrate SUB due to the grooves HM.

Referring to FIG. 4, each groove HM may include first surfaces HMa and a second surface HMb. The first surfaces HMa of the groove HM may include two facing surfaces, and the second surface HMb of the groove HM may be disposed between the first surfaces HMa facing each other. That is, the groove HM may be a space defined by the first surfaces HMa and the second surface HMb.

The first surfaces HMa of the groove HM may be surfaces extending from the base area BA. The first surfaces HMa of the groove HM may form sidewalls of the groove HM, and the second surface HMb of the groove HM may form an upper surface of the groove HM.

The first surfaces HMa of the groove HM may be inclined at a predetermined angle to the base area BA. The second surface HMb of the groove HM may be generally parallel to the base area BA or the upper surface 100US of the electrostatic chuck unit 100. Therefore, the second surface HMb of the groove HM may be inclined from the first surfaces HMa of the groove HM at the predetermined angle. That is, the first surfaces HMa of the groove HM may have a predetermined inclination angle from the second surface HMb of the groove HM and the base area BA. When the cross-sectional shape of each groove HM is a generally trapezoidal shape whose width decreases in the thickness direction (or the depth direction, the third direction DR3) as described above, an angle formed by each first surface HMa of the groove HM and the second surface HMb of the groove HM may be an obtuse angle. In an embodiment, an acute angle $\theta$ between a plane in which the first surfaces HMa of the groove HM are located and a plane in which the second surface HMb of the groove HM is located may be 60 degrees or less. Since the acute angle $\theta$ between the planes in which the first surfaces HMa and the second surface HMb constituting the groove HM are located is 60 degrees or less, a connection electrode layer 140 (see FIG. 11) which will be described later may be prevented from being broken in a process of forming the connection electrode layer.

A gap $W_H$ between parts of the base area BA may be substantially equal to the maximum width WH of the groove HM. The gap WH between the parts of the base area BA may be greater than a width W2 of the second surface HMb of the groove HM. Since the gap WH between the parts of the base area BA is greater than the width W2 of the second surface HMb of the groove HM, the first surfaces HMa of the groove HM may be inclined from the base area BA and the second surface HMb at a predetermined angle.

The lower surface 100BS of the electrostatic chuck unit 100 on which the grooves HM are formed may have different surface steps having different thicknesses. Therefore, the thickness of the electrostatic chuck unit 100 may be different in an area where the grooves HM are formed and an area where the grooves HM are not formed. A thickness h1 of the area where the grooves HM are not formed in the electrostatic chuck unit 100 may be greater than a thickness h2 of the area where the grooves HM are formed in the electrostatic chuck unit 100.

As shown in FIG. 4, a height h3 of each groove HM in the third direction DR3 may be smaller than the thickness h1 of the area where the grooves HM are not formed in the electrostatic chuck unit 100. The height h3 of each groove HM in the third direction DR3 may be smaller than the thickness h2 of the area where the grooves HM are formed in the electrostatic chuck unit 100.

The thickness h1 of the area where the grooves HM are not formed in the electrostatic chuck unit 100 may be substantially equal to the sum of the thickness h2 of the area where the grooves HM are formed in the electrostatic chuck unit 100 and the height h3 of each groove HM in the third direction DR3. In an embodiment, the thickness h1 of the area where the grooves HM are not formed in the electrostatic chuck unit 100 may be about 14 to 20 mm, and the height h3 of each groove HM in the third direction DR3 may be about 5 to 7 mm. Since the grooves HM having the height h3 of about 5 to 7 mm are formed on the lower surface 100BS of the electrostatic chuck unit 100, the laser beam L passing through the target substrate SUB to be described later may travel to the grooves HM. The laser beam L may be reduced in energy while travelling through the grooves HM which are spaces between the lower surface 100BS of the electrostatic chuck unit 100 and the target substrate SUB. Therefore, since the laser beam L passing through the target substrate SUB is reduced in energy while travelling through the grooves HM, it is may fail to reach the lower surface 100BS of the electrostatic chuck unit 100 or may reach the lower surface 100BS of the electrostatic chuck unit 100 with low energy. Therefore, since the energy of the laser beam L is reduced as the laser beam L travels through the grooves HM formed on the lower surface 100BS of the electrostatic chuck unit 100, the lower surface 100BS of the electrostatic chuck unit 100 can be prevented from being damaged by the energy contained in the laser beam L.

Figure 6:
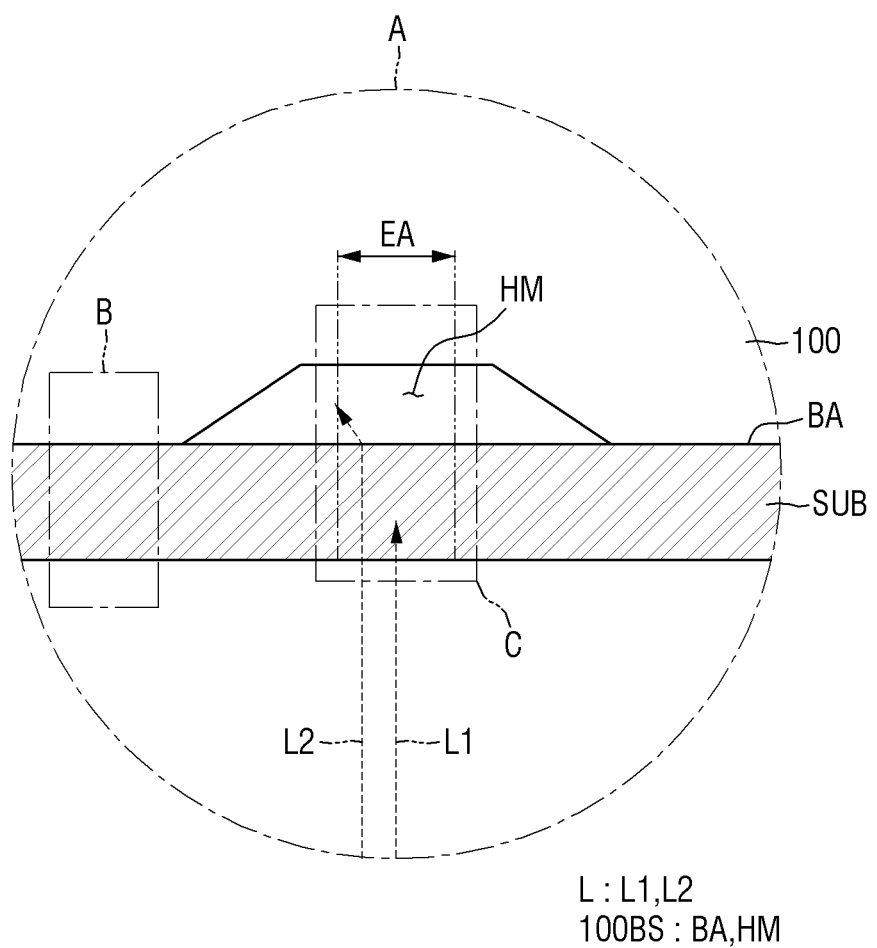
FIG. 6 is an enlarged view of area A of FIG. 5.

FIG. 5 is an enlarged view illustrating a process of etching the target substrate SUB using the etching apparatus 1 of FIG. 1. FIG. 6 is an enlarged view of area A of FIG. 5.

Referring to FIG. 5 in conjunction with FIG. 1, the target substrate SUB may include a processing area EA. The processing area EA may be an area of the target substrate SUB on which an etching process is performed using the etching apparatus 1. The processing area EA may correspond to the process area where the etching process of the target substrate SUB is performed as shown in FIG. 1.

First, the target substrate SUB may be supplied into the first vacuum chamber CH1 through the first gate valve G1. The electrostatic chuck unit 100 may be placed on the target substrate SUB supplied into the first vacuum chamber CH1 by using a separate transfer unit (not illustrated) and may fix the target substrate SUB onto the lower surface 100BS of the electrostatic chuck unit 100. In this case, the processing area EA of the target substrate SUB may be aligned to overlap at least a part of the grooves HM formed on the lower surface 100BS of the electrostatic chuck unit 100 by using the alignment inspection unit 500 described above.

After the processing area EA of the target substrate SUB is aligned to overlap at least a part of the grooves HM formed on the lower surface 100B S of the electrostatic chuck unit 100, the electrostatic chuck unit 100 having the target substrate SUB supported on the lower surface 100BS may be moved by the transfer unit (not illustrated) together with the target substrate SUB to the process area where the etching process is performed.

For ease of description, FIGS. 5 and 6 mainly illustrate the electrostatic chuck unit 100, the target substrate SUB, the first protective window PW1, and the laser module 200 disposed in the area where the etching process is performed.

The target substrate SUB may be placed on the lower surface 100BS of the electrostatic chuck unit 100 on which the grooves HM are formed. The target substrate SUB may contact the base area BA and may be fixed to the electrostatic chuck unit 100. The target substrate SUB may be supported and fixed to the base area BA by the electrostatic force of the electrostatic chuck unit 100. The target substrate SUB may be spaced apart from the electrostatic chuck unit 100 in some areas of the electrostatic chuck unit 100 where the grooves HM are formed.

The laser module 200 may be spaced apart from the electrostatic chuck unit 100 and may irradiate the laser beam L onto the lower surface of the target substrate SUB. The laser beam L irradiated from the laser module 200 may pass through the first chamber window CW1 and enter the first vacuum chamber CH1. The laser beam L passing through the first chamber window CW1 may pass through the first protective window PW1 and reach the lower surface of the target substrate SUB corresponding to the processing area EA of the target substrate SUB.

As the etching process is performed on the target substrate SUB, as shown in FIG. 5, the particles P peeling off the target substrate SUB may fall toward the first protective window PW1 and land on a surface of the first protective window PW1. In this case, the particles P may reduce refraction of the laser beam L or transmittance of the laser beam L, thereby degrading the quality of the etching process. As illustrated in FIG. 1, the contaminated first protective window PW1 may be transferred from the first vacuum chamber CH1 to the second vacuum chamber CH2 through the second gate valve G2 by the transfer unit 300, and a second protective window PW2 may be transferred from the second vacuum chamber CH2 to the first vacuum chamber CH1.

Referring to FIG. 6, the laser beam L irradiated from the laser module 200 onto the lower surface of the target substrate SUB corresponding to the processing area EA may include a first laser beam L1 and a second laser beam L2.

The first laser beam L1 may be a laser beam that fails to pass through the target substrate SUB among the laser beams L irradiated to the target substrate SUB. The first laser beam L1 may fail to pass through the target substrate SUB because the energy of the first laser beam L1 is exhausted in etching a part of the target substrate SUB. The first laser beam L1 is irradiated to the lower surface of the target substrate SUB corresponding to the processing area EA, and its energy is exhausted in etching a plurality of organic layers and/or inorganic layers included in the target substrate SUB to be described later. Therefore, the first laser beam L1 may fail to pass through the target substrate SUB.

The second laser beam L2 may be a laser beam that passes through the target substrate SUB among the laser beams L irradiated to the target substrate SUB. The second laser beam L2 may be a laser beam that passes through the target substrate SUB and travels to the lower surface 100BS of the electrostatic chuck unit 100 with the energy remaining after being used to etch a part of the target substrate SUB. Since the processing area EA of the target substrate SUB is placed to overlap a groove HM of the electrostatic chuck unit 100 in the third direction DR3, the second laser beam L2 travelling toward the lower surface 100BS of the electrostatic chuck unit 100 after passing through the target substrate SUB may travel to the groove HM. As the second laser beam L2 having the energy travels through the groove HM which is a space between the target substrate SUB and the electrostatic chuck unit 100, predetermined energy of the second laser beam L2 may be exhausted. Therefore, since the predetermined energy is exhausted as the second laser beam L2 having the energy travels through the groove HM, the second laser beam L2 with the reduced energy may reach the lower surface 100BS of the electrostatic chuck unit 100. Accordingly, the lower surface 100BS of the electrostatic chuck unit 100 can be prevented from being damaged by the laser beam L.

Figure 7:
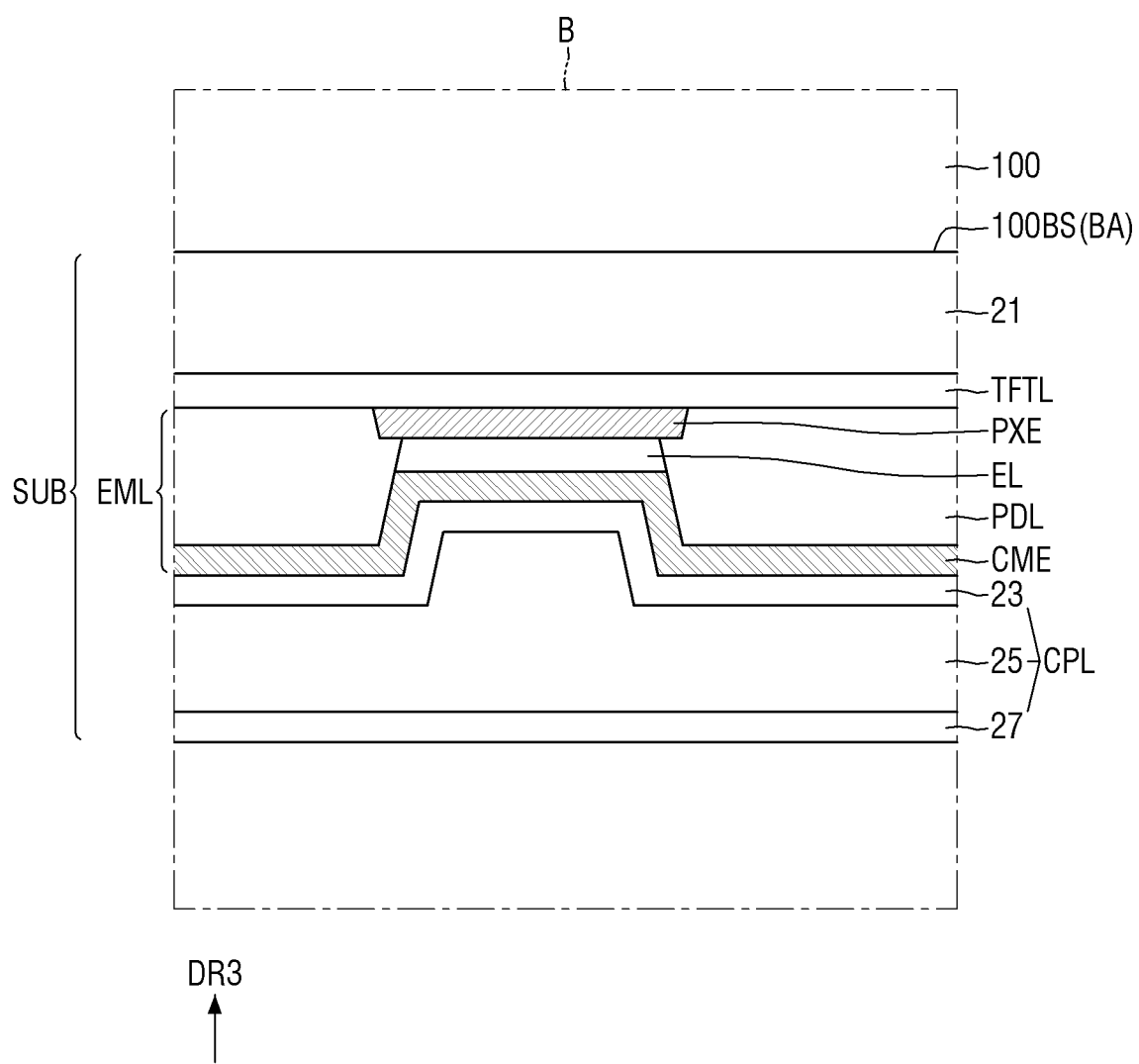
FIG. 7 is an enlarged view of area B of FIG. 6.
Figure 8:
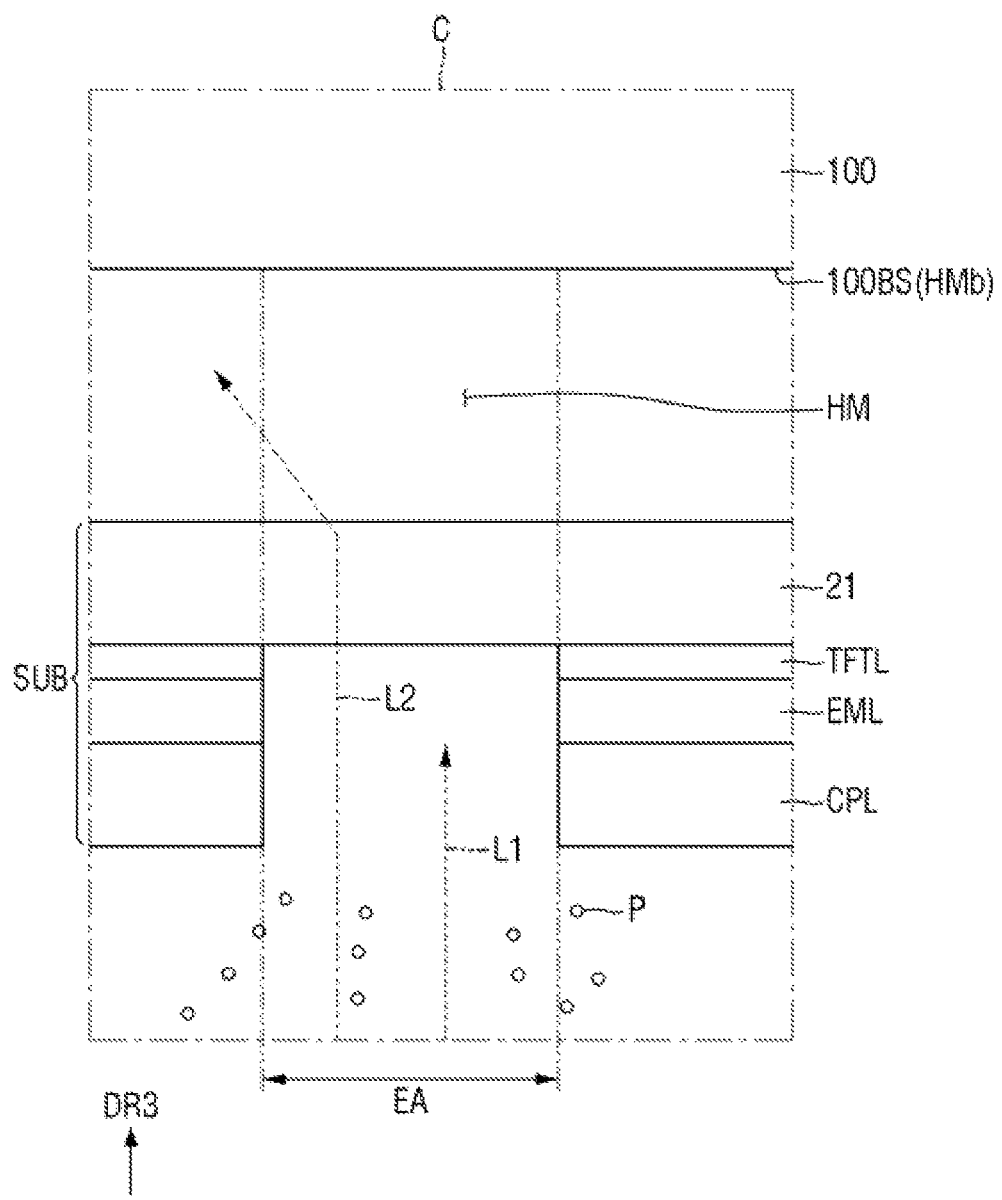
FIG. 8 is an enlarged view of area C of FIG. 6.

FIG. 7 is an enlarged view of area B of FIG. 6. FIG. 8 is an enlarged view of area C of FIG. 6.

A plurality of layers of the target substrate SUB which are sequentially stacked from the lower surface 100BS of the electrostatic chuck unit 100 in a direction opposite to the third direction DR3 will now be described.

Referring to FIG. 7, the target substrate SUB may include a substrate 21, a circuit element layer TFTL disposed on the substrate 21, a light emitting element layer EML disposed on the circuit element layer TFTL, and a thin-film encapsulation layer CPL disposed on the light emitting element layer EML. However, the embodiments are not limited thereto, and another layer may also be further disposed between the layers, and some of the stacked members may also be omitted.

As described above, the target substrate SUB may include a substrate of an organic light emitting display device. In an embodiment, the target substrate SUB may be a display panel of an organic light emitting display device.

The substrate 21 may support each layer disposed on the substrate 21. The substrate 21 may be made of an insulating material such as polymer resin or an inorganic material such as glass or quartz.

The circuit element layer TFTL may be disposed on the substrate 21. The circuit is element layer TFTL may include not only a thin-film transistor of each pixel but also scan lines, data lines, power lines, scan control lines, fan-out lines, and routing lines connecting pads and the data lines. Each thin-film transistor may include a gate electrode, a semiconductor layer, a source electrode, and a drain electrode.

The light emitting element layer EML may be disposed on the circuit element layer TFTL. The light emitting element layer EML may include a pixel electrode PXE a pixel defining layer PDL, a light emitting layer EL, and a common electrode CME.

The pixel electrode PXE may be disposed on the circuit element layer TFTL. The pixel electrode PXE may be a first electrode, e.g., an anode of an LED. The pixel electrode PXE may have a stacked structure in which a material layer having a high work function such as indium tin oxide (ITO), indium zinc oxide (IZO), zinc oxide (ZnO) or indium oxide (In2O3) and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture of the same are stacked. The material layer having a high work function may be disposed on the reflective material layer to be close to the light emitting layer EL. The pixel electrode PXE may have, but is not limited to, a multilayer structure of ITO/Mg, ITO/MgF, ITO/Ag or ITO/Ag/ITO.

The pixel defining layer PDL may be disposed on the circuit element layer TFTL along the boundary of each pixel. The pixel defining layer PDL may be disposed on the pixel electrode PXE and may include an opening exposing the pixel electrode PXE.

The light emitting layer EL is disposed on the pixel electrode PXE exposed by the pixel defining layer PDL. The light emitting layer EL may be an organic light emitting layer including an organic material. In this case, the light emitting layer EL may include a hole transporting layer, an organic light emitting layer, and an electron transporting layer.

The common electrode CME may be disposed on the light emitting layer EL. The common electrode CME may not only contact the light emitting layer EL but also contact an upper surface of the pixel defining layer PDL. The common electrode CME may be integrally connected without distinction between pixels. The common electrode CME may be a whole-surface electrode disposed over the whole surface without distinction between pixels. The common electrode CME may be a second electrode, e.g., a cathode of the LED.

The thin-film encapsulation layer CPL may be disposed on the light emitting element layer EML. The thin-film encapsulation layer CPL may include a first inorganic layer 23, an organic layer 25, and a second inorganic layer 27. Each of the first inorganic layer 23 and the second inorganic layer 27 may include silicon nitride, silicon oxide, or silicon oxynitride. The organic layer 25 may include an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB).

Referring to FIG. 8 in conjunction with FIG. 7, an etching process may be performed on inorganic layers or organic layers included in the target substrate SUB by using the etching apparatus 1. In an embodiment, the target substrate SUB may include the substrate 21, the circuit element layer TFTL disposed on the substrate 21, the light emitting element layer EML and the thin-film encapsulation layer CPL, and organic layers and/or inorganic layers of the circuit element layer TFTL, the light emitting element layer EML and the thin-film encapsulation layer CPL which overlap the processing area EA may be etched using the etching apparatus 1. Through the etching process, a hole may be formed to penetrate the circuit element layer TFTL, the light emitting element layer EML and the thin-film encapsulation layer CPL of the target substrate SUB which overlap the processing area EA. In the etching process, the substrate 21 overlapping the processing area EA may not be etched.

Specifically, of the laser beam L irradiated from the laser module 200, the first laser beam L1 may exhaust its energy in etching a plurality of organic layers and/or inorganic layers disposed in an area overlapping the processing area EA. Therefore, the first beam L1 may be unable to pass through the substrate 21 of the target substrate SUB. Of the laser beam L irradiated from the laser module 200, the second laser beam L2 may have the energy remaining after being used to etch the organic layers and/or inorganic layers disposed in the area overlapping the processing area EA. Therefore, the second laser beam L2 may pass through the substrate 21 of the target substrate SUB and travel to a groove HM which is a space between the electrostatic chuck unit 100 and the target substrate SUB. The second laser L2 reaching the groove HM may exhaust its energy while travelling through the groove HM. Thus, the second laser beam L2 may not reach the lower surface 100BS of the electrostatic chuck unit 100.

Figure 9:
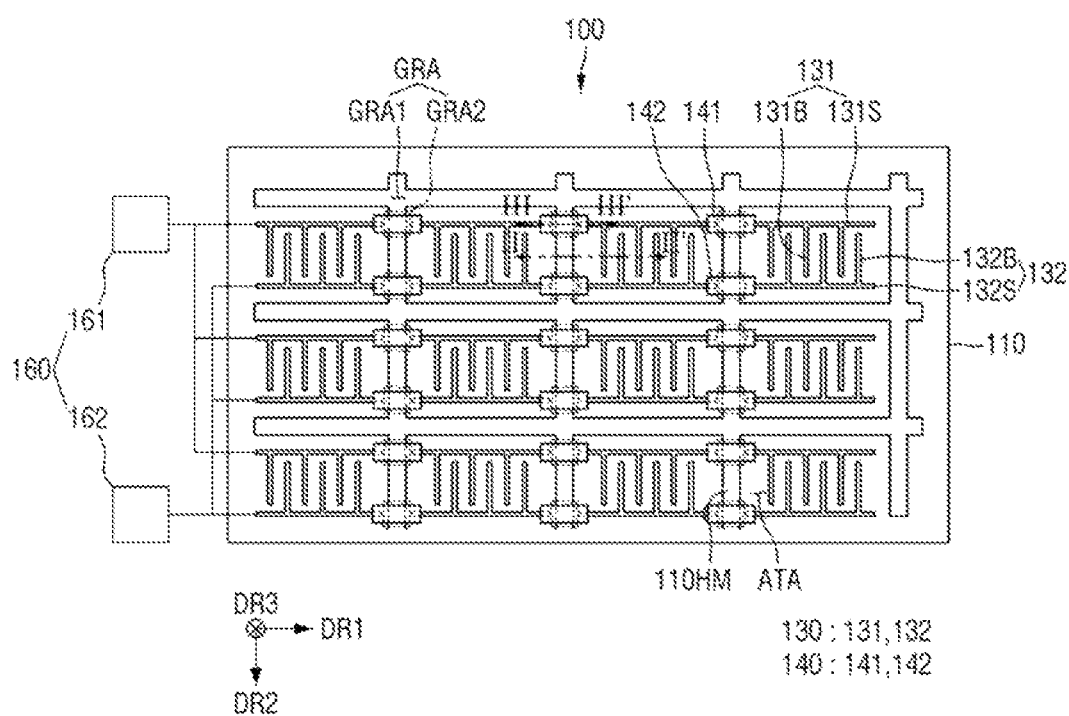
FIG. 9 is a bottom layout view showing an embodiment of the relative arrangement of grooves, an electrode layer, and a connection electrode layer of the electrostatic chuck unit of FIG. 1.
Figure 10:
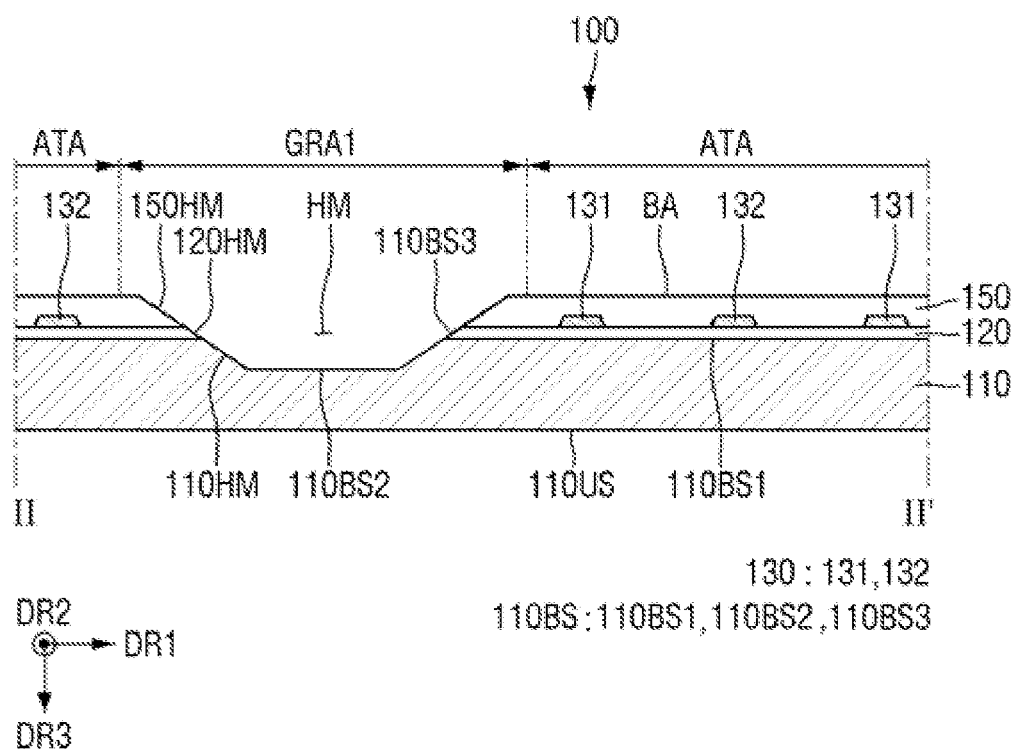
FIG. 10 is a cross-sectional view of a first embodiment taken along line II-II' of FIG. 9.
Figure 11:
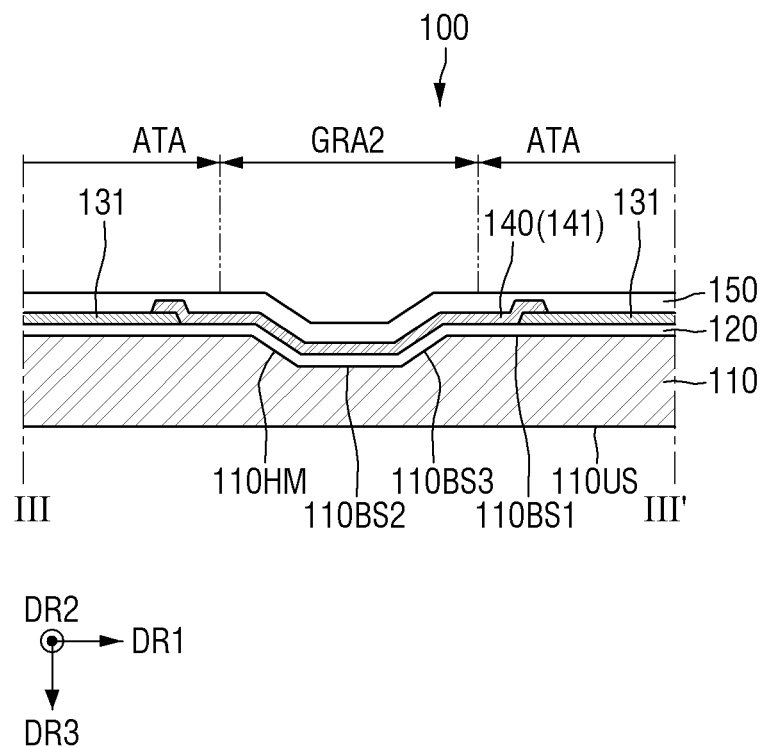
FIG. 11 is a cross-sectional view of an embodiment taken along line III-III' of FIG. 9.

FIG. 9 is a bottom layout view showing an embodiment of the relative arrangement of grooves, an electrode layer 130, and connection electrodes 141 and 142 of the electrostatic chuck unit 100 of FIG. 1. FIG. 10 is a cross-sectional view of a first embodiment taken along line II-II' of FIG. 9. FIG. 11 is a cross-sectional view of an embodiment taken along line III-III' of FIG. 9. It should be noted that the third direction DR3 faces downward in FIGS. 10 and 11.

Referring to FIGS. 9 through 11, the electrostatic chuck unit 100 may include a base substrate 110, a first dielectric layer 120 disposed on the base substrate 110, the electrode layer 130, a connection electrode layer 140, a second dielectric layer 150, and a power device 160. In the illustrated embodiment, the electrostatic chuck unit 100 may support the target substrate SUB with electrostatic force by using first electrodes 131 and second electrodes 132 included in the electrode layer 130 which will be described later.

The planar shape of the base substrate 110 may correspond to the planar shape of the electrostatic chuck unit 100. When the planar shape of the electrostatic chuck unit 100 is a generally rectangular shape having long sides in the first direction DR1 and short sides in the second direction DR2, the planar shape of the base substrate 110 may also be a generally rectangular shape including long sides in the first direction DR1 and short sides in the second direction DR2.

The base substrate 110 may include a groove area GRA in which a plurality of grooves 110HM are formed and a flat area ATA in which the grooves 110HM are not formed. The groove area GRA may correspond to the planar shapes of the grooves HM of the electrostatic chuck unit 100 described above. The groove area GRA may have a shape substantially same as the planar shapes of the grooves HM of the electrostatic chuck unit 100. The flat area ATA may be an area excluding the groove area GRA and may be a substantially flat area in which the grooves 110HM are not formed in the base substrate 110.

The groove area GRA may include a first groove area GRA1 in which the connection electrode layer 140 to be described later is not disposed and second groove areas GRA2 in which the connection electrode layer 140 is disposed. The second groove areas GRA2 may not overlap the above-described processing area EA of the target substrate SUB in the third direction DR3.

The base substrate 110 may support the first dielectric layer 120, the electrode layer 130, the connection electrode layer 140, and the second dielectric layer 150 which will be described later. The base substrate 110 may be made of a ceramic material.

Referring to FIG. 3, the base substrate 110 may include an upper surface 110US and a lower surface 110BS facing the upper surface 110US.

The upper surface 110US of the base substrate 110 may be the upper surface 100US of the electrostatic chuck unit 100. The grooves 110HM formed in areas corresponding to the grooves HM of the electrostatic chuck unit 100 may be formed on the lower surface 110BS of the base substrate 110.

The lower surface 110BS of the base substrate 110 may include a first surface 110BS1, a second surface 110BS2, and third surfaces 110BS3.

The first surface 110BS1 may be a surface facing the upper surface 110US of the base substrate 110. The first surface 110BS1 may be a substantially flat surface.

Each groove 110HM formed on the lower surface 110BS of the base substrate 110 may be composed of the second surface 110BS2 and the third surfaces 110BS3 of the base substrate 110. The third surfaces 110BS3 of the base substrate 110 may be surfaces extending from the first surface 110BS of the base substrate 110. The third surfaces 110BS3 of the base substrate 110 may include two surfaces facing each other. The second surface 110BS2 of the base substrate 110 may be disposed between the facing third surfaces 110BS3 of the base substrate 110.

The first dielectric layer 120 may be disposed on the lower surface 110BS of the base substrate 110. The first dielectric layer 120 may prevent generation of leakage current in the electrode layer 130 and/or the connection electrode layer 140 which will be described later.

The first dielectric layer 120 may be disposed in the flat area ATA. Referring to FIG. 10, the first dielectric layer 120 may not be disposed in the first groove area GRA1. Referring to FIG. 11, the first dielectric layer 120 may be disposed in the second groove areas GRA2. That is, the first dielectric layer 120 may expose at least a part of a surface of the base substrate 110 in the groove area GRA. The first dielectric layer 120 may be disposed only in the flat area ATA and/or the second groove areas GRA2 not overlapping the processing area EA. Therefore, it is possible to prevent the first dielectric layer 120 from being damaged by the laser beam L transmitted through the target substrate SUB.

The first dielectric layer 120 may be entirely disposed on the first surface 110BS1 of the base substrate 110. The first dielectric layer 120 may not be disposed on the lower surface 110BS, i.e., the second surface 110BS2 and the third surfaces 110BS3 of the base substrate 110 which overlap the first groove area GRA1. The first dielectric layer 120 may not be disposed on the lower surface 110BS, i.e., the second surface 110BS2 and the third surfaces 110BS3 of the base substrate 110 which overlap the second groove areas GRA2. Since the first dielectric layer 120 is disposed only on the lower surface 110BS of the base substrate 110 which does not overlap the processing area EA of the target substrate SUB, it can be prevented from being damaged by the laser beam L.

The electrode layer 130 may be disposed on the first dielectric layer 120. The electrode layer 130 may include the first electrodes 131 and the second electrodes 132. The electrode layer 130 may include a conductive material.

The first electrodes 131 and the second electrodes 132 may be electrically insulated from each other. The first electrodes 131 and the second electrodes 132 may have different polarities. For example, the first electrodes 131 may have a positive (+) polarity, and the second electrodes 132 may have a negative (−) polarity. However, the embodiments are not limited thereto, and the first electrode 131 may also have a negative (−) polarity, and the second electrode 132 may also have a positive (+) polarity. Since the first electrodes 131 and the second electrodes 132 have different polarities, they may generate an electrostatic force.

The first electrodes 131 and the second electrodes 132 may be disposed in the flat area ATA. The flat area ATA may include island (isolated) shapes due to the grooves 110HM formed on the lower surface 110BS of the base substrate 110. The first electrodes 131 and the second electrodes 132 may be disposed in areas defined by the grooves 110HM formed on the lower surface 110BS of the base substrate 110.

The first electrodes 131 may be disposed in the areas defined by the grooves 110HM formed on the lower surface 110BS of the base substrate 110. Each of the first electrodes 131 may include a first electrode stem part 131S and a plurality of first electrode branch parts 131B branching from the first electrode stem part 131S.

The first electrode stem part 131S may extend in the first direction DR1 in plan view. The first electrode stem part 131S may extend in the first direction DR1, but both ends of the first electrode stem part 131S may end in the flat area ATA so that they are spaced apart from adjacent grooves HM. The first electrode stem parts 131S disposed in the flat area ATA and spaced apart from each other along the same row (e.g., the first direction DR1) may lie on substantially the same straight line.

The first electrode branch parts 131B may branch from the first electrode stem part 131S. The first electrode branch parts 131B may branch from the first electrode stem part 131S and extend along the second direction DR2. The first electrode branch parts 131B may be spaced apart from each other in the first direction DR1 and may be disposed substantially parallel to each other.

Each of the second electrodes 132 may include a second electrode stem part 132S and a plurality of second electrode branch parts 132B branching from the second electrode stem part 132S. The second electrodes 132 may be spaced apart from the first electrodes 131.

The second electrode stem part 132S may extend in the first direction DR1 in plan view. The second electrode stem part 132S may extend in the first direction DR1, but both ends of the second electrode stem part 132S may end in the flat area ATA so that they are spaced apart from adjacent grooves HM. The second electrode stem part 132S may be spaced apart from the first electrode stem part 131S in the second direction DR2. The second electrode stem parts 132S disposed in the flat area ATA and spaced apart from each other along the same row (e.g., the first direction DR1) may lie on substantially the same straight line.

The second electrode branch parts 132B may branch from the second electrode stem part 132S. The second electrode branch parts 132B may branch from the second electrode stem part 132S and extend along the second direction DR2. The second electrode branch parts 132B may be spaced apart from each other in the first direction DR1 and may be disposed substantially parallel to each other.

The first electrode branch parts 131B and the second electrode branch parts 132B may extend in the second direction DR2 and may be alternately arranged in the first direction DR1.

The connection electrode layer 140 may be disposed on the electrode layer 130. The connection electrode layer 140 may electrically connect the electrode stem parts 131S and 132S spaced apart from each other along the same row (e.g., the first direction DR1). The connection electrode layer 140 may include a conductive material.

The connection electrode layer 140 may include first connection electrodes 141 and second connection electrodes 142. The connection electrode layer 140 may be disposed in the second groove areas GRA2. Specifically, the connection electrode layer 140 may be disposed on the first dielectric layer 120 disposed in the second groove areas GRA2.

Each of the first connection electrodes 141 may contact respective ends of the first electrode stem parts 131S spaced apart from each other along the same row (e.g., the first direction DR1) to electrically connect them. That is, the first electrodes 131 spaced apart from each other along the same row (e.g., the first direction DR1) may be electrically connected to each other.

Each of the second connection electrodes 142 may contact respective ends of the second electrode stem parts 132S spaced apart from each other along the same row (e.g., the first direction DR1) to electrically connect them. That is, the second electrodes 132 spaced apart from each other along the same row (e.g., the first direction DR1) may be electrically connected to each other.

Referring to FIG. 11, the connection electrode layer 140 may be disposed across the grooves 110HM of the base substrate 110. The second surface 110BS2 and the third surfaces 110BS3 constituting each of the grooves 110HM of the base substrate 110 may be formed to have an obtuse inclination angle, thereby minimizing layer formation defects in the process of forming the connection electrode layer 140 disposed across the grooves 110HM of the base substrate 110.

The second dielectric layer 150 may be disposed on the connection electrode layer 140. The second dielectric layer 150 may be disposed in the flat area ATA. The second dielectric layer 150 may not be disposed in the first groove area GRA1 but may be disposed in the second groove areas GRA2. That is, the second dielectric layer 150 may be disposed on the electrode layer 130 and/or the connection electrode layer 140. The second dielectric layer 150 may completely cover the electrode layer 130 and/or the connection electrode layer 140 disposed on the first dielectric layer 120.

Referring to FIG. 10, in the first groove area GRA1, side surfaces 120HM of the first dielectric layer 120 and side surfaces 150HM of the second dielectric layer 150 may be aligned substantially parallel to each other. The side surfaces 120HM of the first dielectric layer 120 and the side surfaces 150HM of the second dielectric layer 150 may be aligned substantially parallel to the third surfaces 110BS3 of each groove 110HM of the base substrate 110. Each groove 110HM (The third surfaces 110BS3 of each groove 110HM) of the base substrate 110, the side surfaces 120HM of the first dielectric layer 120, and the side surfaces 150HM of the second dielectric layer 150 may form the first surfaces HMa of each groove HM as shown in FIG. 4 of the electrostatic chuck unit 100.

The power device 160 may include a first power device 161 and a second power device 162. The first power device 161 may transmit an electrical signal to the first electrodes 131. The second power device 162 may transmit an electrical signal to the second electrodes 132. Although the electrostatic chuck unit 100 including one first power device 161 and one second power device 162 is illustrated in the drawings, the embodiments are not limited thereto. For example, the electrostatic chuck unit 100 may also include a plurality of first and second power devices 161 and 162.

Electrostatic chuck units according to other embodiments will now be described. In the following embodiments, the same elements as those described above are indicated by the same reference numerals, and thus a redundant description thereof will be omitted or given briefly.

Figure 12:
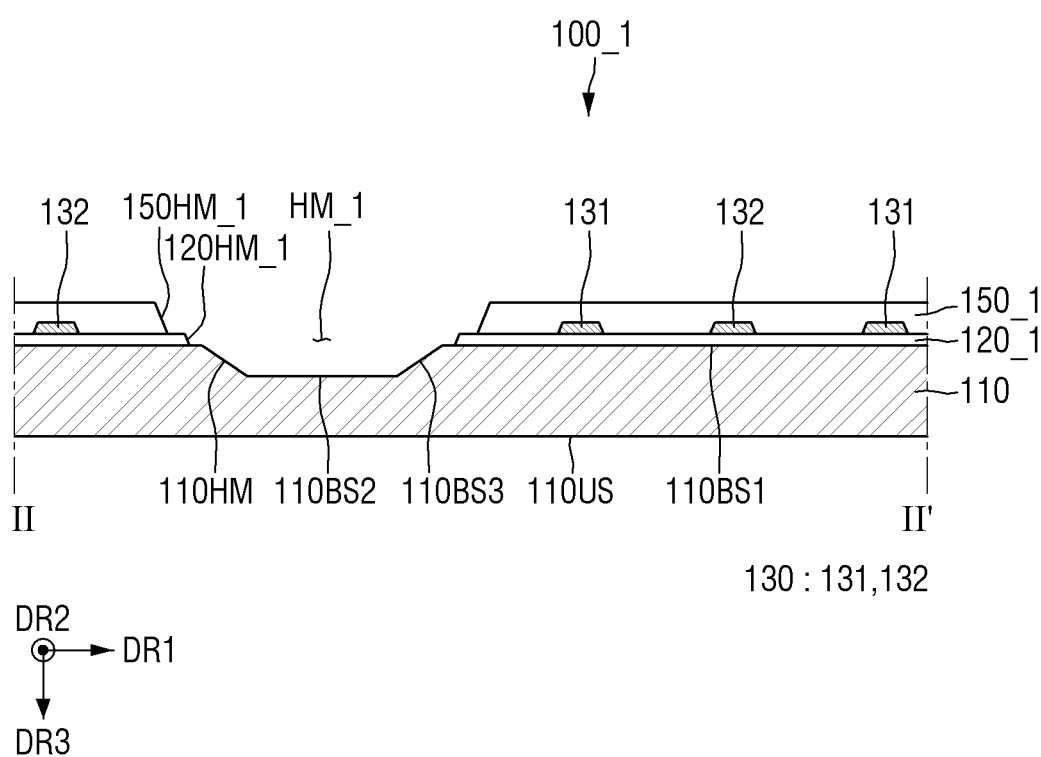
FIG. 12 is a cross-sectional view of a second embodiment taken along line II-II' of FIG. 9.

FIG. 12 is a cross-sectional view of a second embodiment taken along line II-II' of FIG. 9.

Referring to FIG. 12, the illustrated embodiment is different from the embodiment of FIG. 10 in that side surfaces 120HM_1 and 150HM_1 of a first dielectric layer 120_1 and a second dielectric layer 150_1 are not aligned substantially parallel to third surfaces 110BS3 of a base substrate 110.

Specifically, the first dielectric layer 120_1 disposed on a first surface 110BS1 of the base substrate 110 may be recessed from the third surfaces 110BS3 of the base substrate 110. The side surfaces 120HM_1 of the first dielectric layer 120_1 may be disposed on the first surface 110BS1 of the base substrate 110. The side surfaces 120HM_1 of the first dielectric layer 120_1 may be aligned further in than the third surfaces 110BS3 of the base substrate 110 which constitute each groove 110HM of the base substrate 110, thereby exposing a part of the first surface 110BS1 of the base substrate 110 in the thickness direction.

The second dielectric layer 150_1 disposed on a lower surface of the first dielectric layer 120_1 may be recessed from the side surfaces 120HM_1 of the first dielectric layer 120_1. The side surfaces 150HM_1 of the second dielectric layer 150_1 may be aligned further in than the side surfaces 120HM_1 of the first dielectric layer 120_1 to expose a part of the lower surface of the first dielectric layer 120_1 in the thickness direction.

The respective side surfaces 120HM_1 and 150HM_1 of the first and second dielectric layers 120_1 and 150_1 may not be aligned substantially parallel to the third surfaces 110BS3 of the base substrate 110. Therefore, a plurality of grooves HM_1 of an electrostatic chuck unit 100_1 may each be composed of a groove 110HM of the base substrate 110, the side surfaces 120HM_1 of the first dielectric layer 120_1, and the side surfaces 150HM_1 of the second dielectric layer 150_1 which are not aligned substantially parallel to each other. The configuration of the illustrated embodiment may be formed by a process of forming the first and second dielectric layers 120_1 and 150_1 on the base substrate 110 through patterning.

Figure 13:
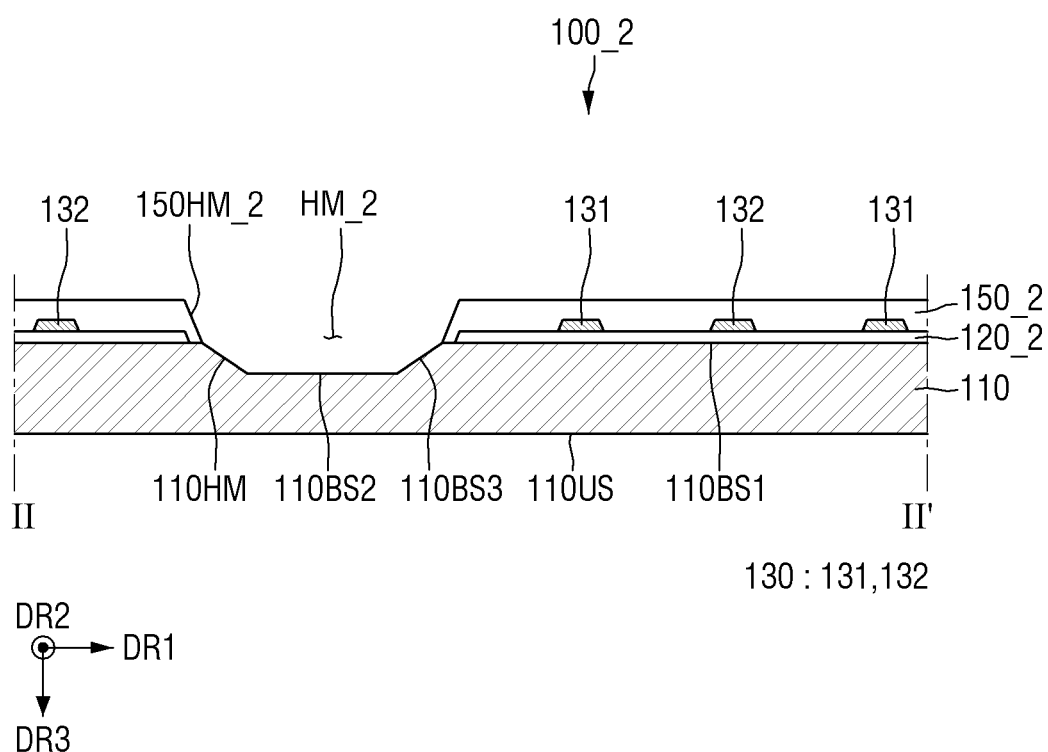
FIG. 13 is a cross-sectional view of a third embodiment taken along line II-II' of FIG. 9.
Figure 14:
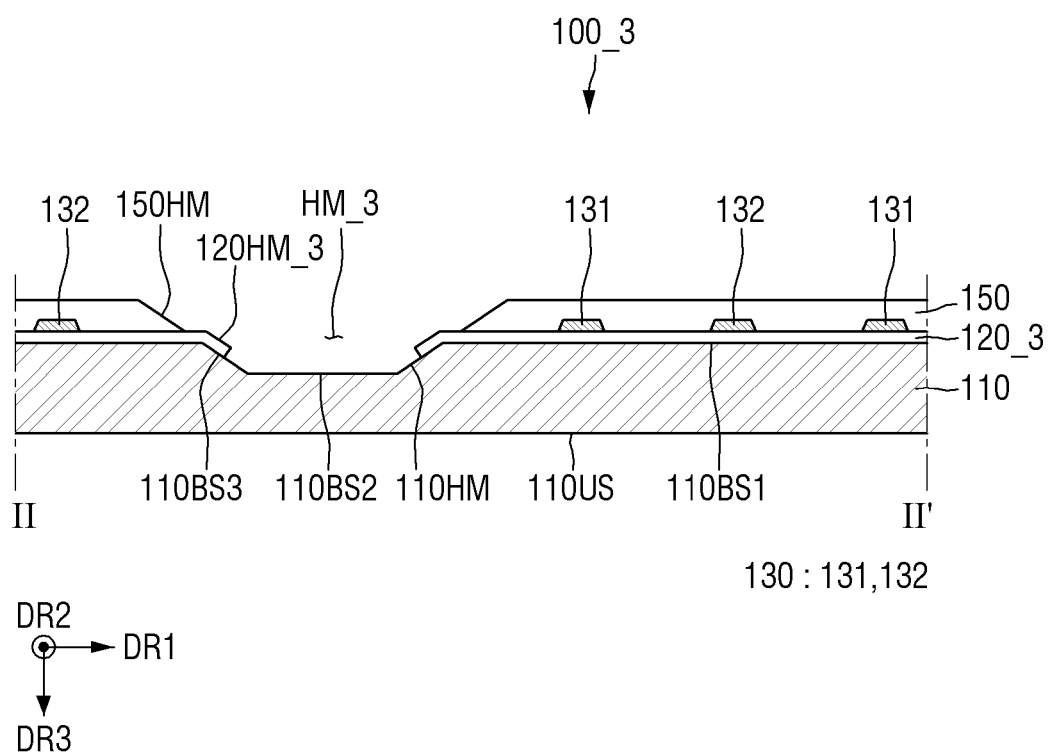
FIG. 14 is a cross-sectional view of a fourth embodiment taken along line II-II' of FIG. 9.
Figure 15:
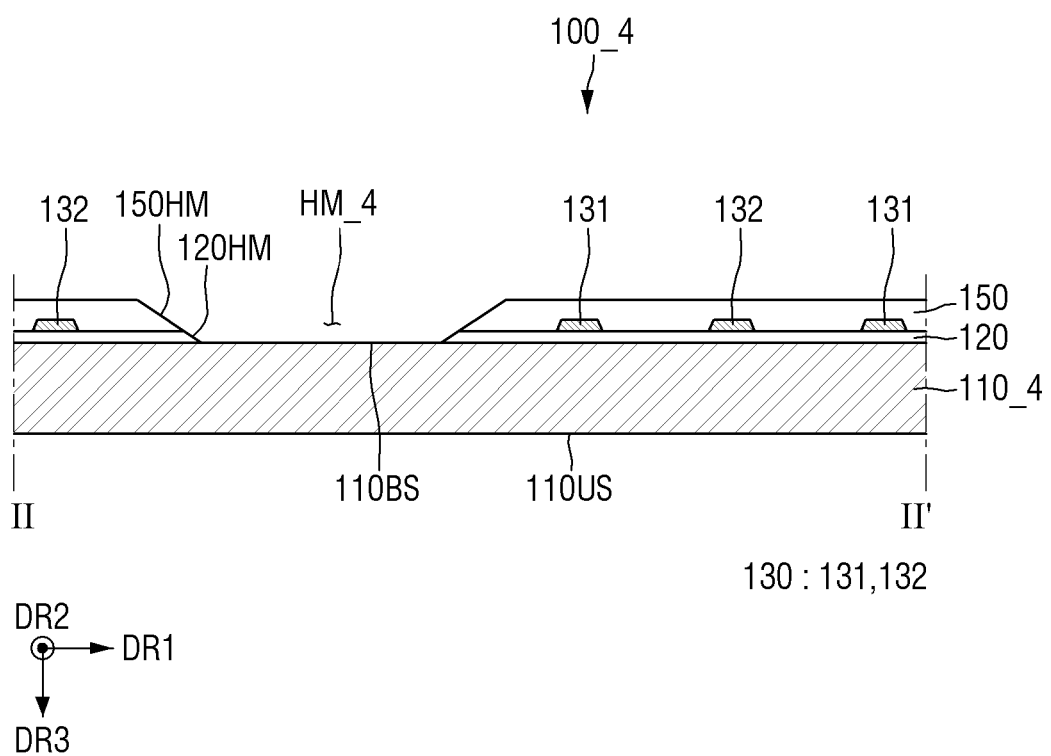
FIG. 15 is a cross-sectional view of a fifth embodiment taken along line II-II' of FIG. 9.

FIG. 13 is a cross-sectional view of a third embodiment taken along line II-II' of FIG. 9. FIG. 14 is a cross-sectional view of a fourth embodiment taken along line II-IF of FIG. 9. FIG. 15 is a cross-sectional view of a fifth embodiment taken along line II-II' of FIG. 9.

Referring to FIG. 13, a second dielectric layer 150_2 according to the illustrated embodiment may extend outward to completely cover lower and side surfaces of a first dielectric layer 120_2 and may be disposed on a first surface 110BS1 of a base substrate 110 exposed by the first dielectric layer 120_2. Side surfaces 152HM_2 of the second dielectric layer 150_2 may be inclined at an inclination angle different from that of third surfaces 110BS3 of the base substrate 110. In the illustrated embodiment, each groove HM_2 of an electrostatic chuck unit 100_2 may be composed of a groove 110HM of the base substrate 110 and the side surfaces 150HM_2 of the second dielectric layer 150_2.

Referring to FIG. 14, a first dielectric layer 120_3 may extend outward to completely cover a first surface 110BS1 of a base substrate 110 and may also be disposed on third surfaces 110BS3 of the base substrate 110 which constitute each groove 110MH formed on a lower surface of the base substrate 110.

Referring to FIG. 15, the illustrated embodiment is different from the embodiment of FIG. 10 in that grooves are not formed in a base substrate 110_4. Specifically, grooves may not be formed in the base substrate 110_4. Each groove HM_4 of an electrostatic chuck unit 100_4 may be composed of side surfaces 120HM of a first dielectric layer 120 and side surfaces 150HM of a second dielectric layer 150. Even in this case, the first dielectric layer 120 and the second dielectric layer 150 are not disposed in an area, e.g., a first groove area GRA1 overlapping the processing area EA of the target substrate SUB. Therefore, even if a laser beam L reaches this area, the first dielectric layer 120 and/or the second dielectric layer 150 may not be damaged. Thus, there may be no particles peeling off the base substrate 110_4.

Figure 16:
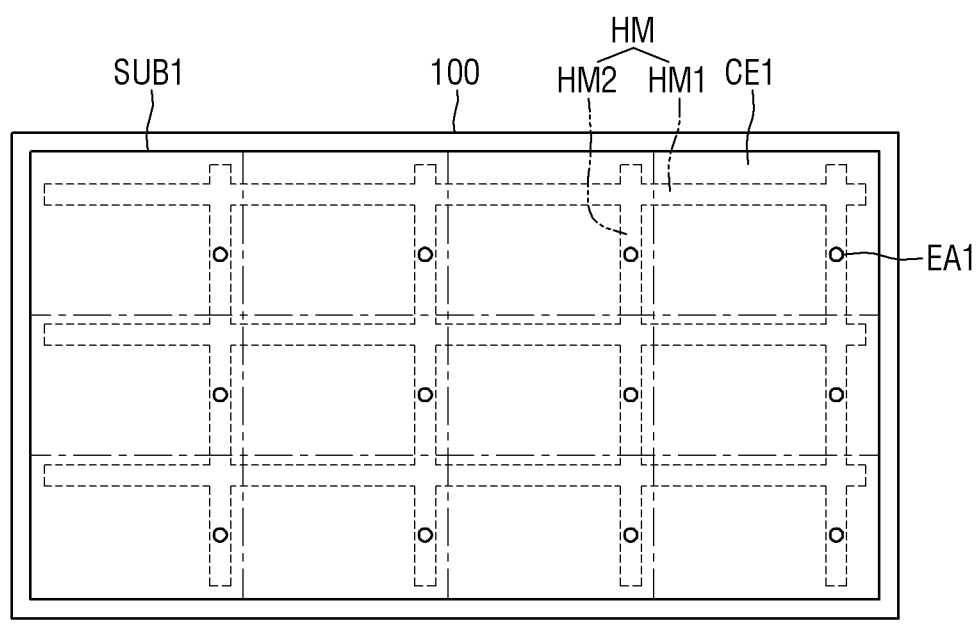
FIG. 16 is a bottom layout view showing an embodiment of the relative arrangement of the electrostatic chuck unit and a first target substrate.
Figure 16:
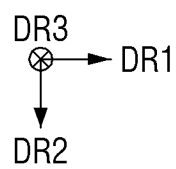
Figure 17:
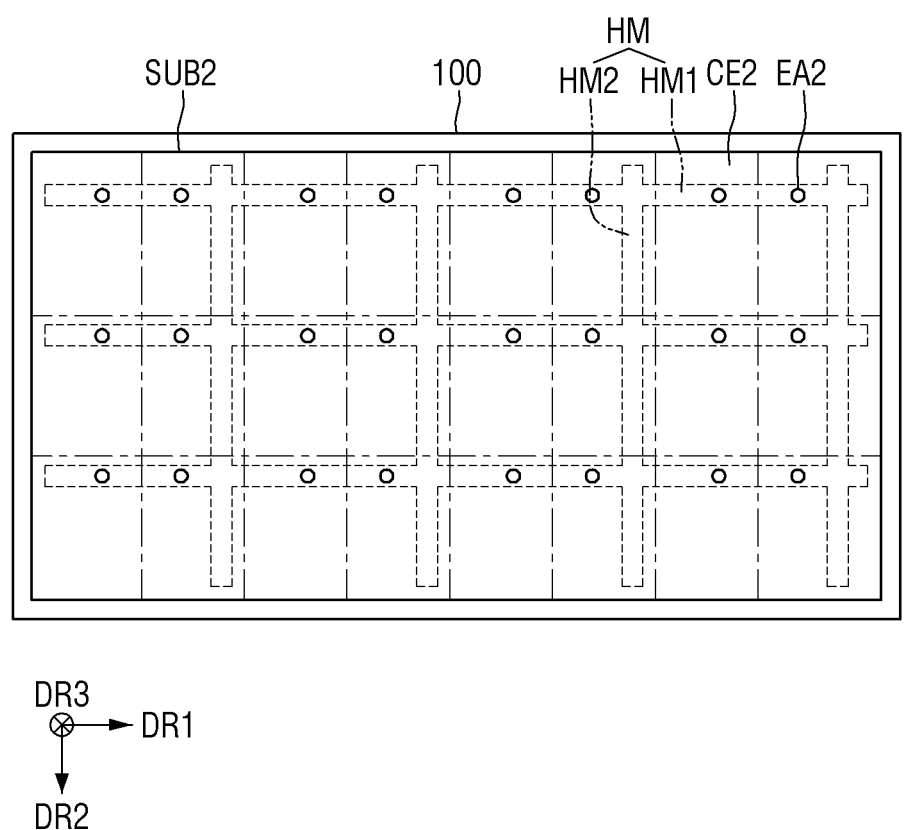
FIG. 17 is a bottom layout view showing an embodiment of the relative arrangement of the electrostatic chuck unit and a second target substrate.

FIG. 16 is a bottom layout view showing an embodiment of the relative arrangement of the electrostatic chuck unit 100 and a first target substrate SUB1. FIG. 17 is a bottom layout view showing an embodiment of the relative arrangement of the electrostatic chuck unit 100 and a second target substrate SUB2.

Referring to FIGS. 16 and 17, an etching apparatus 1 including the electrostatic chuck unit 100 according to the illustrated embodiment is an example showing that an etching process can be performed on a target substrate SUB without replacement of the electrostatic chuck unit 100 even when the target substrate SUB is changed.

Specifically, each of the target substrates SUB1 and SUB2 of FIGS. 16 and 17 may be a mother substrate including a plurality of unit cells CE1 or CE2. Each of the unit cells CE1 and CE2 included in the target substrates SUB1 and SUB2 may be a display panel 20 of a display device 2 which will be described later through other drawings.

Referring to FIG. 16, a plurality of unit cells CE1 illustrated in FIG. 16 may be arranged in a matrix shape on the target substrate SUB1. The unit cells CE1 may be arranged along the first direction DR1 and the second direction DR2. In the embodiment illustrated in FIG. 16, the target substrate SUB1 includes four columns and three rows of unit cells CE1, that is, a total of twelve unit cells CE1. However, the number of unit cells CE1 included in the target substrate SUB1 is not limited thereto.

Each unit cell CE1 may include at least one processing area EA1. The processing area EA1 included in each unit cell CE1 may overlap one of a plurality of grooves HM formed on a lower surface of the electrostatic chuck unit 100 in the third direction DR3. Specifically, the processing area EA1 included in each unit cell CE1 of the illustrated embodiment may overlap a second groove HM2 extending in the electrostatic chuck unit 100 along the second direction DR2. Therefore, a laser beam L emitted from a laser module 200 and irradiated to a plurality of processing areas EA1 of the target substrate SUB1 may be reduced in energy while travelling through the grooves HM as described above even after passing through the target substrate SUB1. Thus, even if the laser beam L reaches the lower surface of the electrostatic chuck unit 100, the lower surface of the electrostatic chuck unit 100 can be prevented from being damaged. In addition, since the grooves HM of the electrostatic chuck unit 100 are not only formed in areas corresponding to the processing areas EA1 of the target substrate SUB1 but also extend along the first direction DR1 and/or the second direction DR2, it may be unnecessary to additionally design the planar shapes of the grooves HM of the electrostatic chuck unit 100 even when the processing areas of the target substrate are changed.

Referring to FIG. 17, a plurality of unit cells CE2 illustrated in FIG. 17 may be arranged in a matrix shape on the target substrate SUB2. The unit cells CE2 may be arranged along the first direction DR1 and the second direction DR2. In the embodiment illustrated in FIG. 17, the unit cells CE2 may be arranged differently from the unit cells CE1 of FIG. 16. For example, in the embodiment illustrated in FIG. 17, the target substrate SUB2 includes eight columns and three rows of unit cells CE2, that is, a total of twenty four unit cells CE2.

Each unit cell CE2 may include at least one processing area EA2. The processing area EA2 included in each unit cell CE2 may be different from the processing areas EA1 illustrated in FIG. 16 in terms of position and arrangement. Even in this case, the processing area EA2 included in each unit cell CE2 may overlap one of a plurality of grooves HM formed on the lower surface of the electrostatic chuck unit 100 in the third direction DR3. Specifically, the processing area EA2 included in each unit cell CE2 of the illustrated embodiment may overlap a first groove HM1 extending in the electrostatic chuck unit 100 along the first direction DR1. Therefore, a laser beam L emitted from the laser module 200 and irradiated to a plurality of processing areas EA2 of the target substrate SUB2 may be reduced in energy by the grooves HM even after passing through the target substrate SUB2.

As illustrated in FIGS. 16 and 17, although the unit cells CE1 and CE2 and/or the processing areas EA1 and EA2 included in the target substrates SUB1 and SUB2 are different in position and size, since the grooves HM are continuously formed on the lower surface of the electrostatic chuck unit 100 to extend along the first direction DR1 and the second direction DR2, an etching process can be performed without replacement of the electrostatic chuck unit 100 even when target substrates are changed. Therefore, the replacement time of the electrostatic chuck unit 100 is reduced, thereby increasing the efficiency of a process of manufacturing a display device through the etching process.

Figure 18:
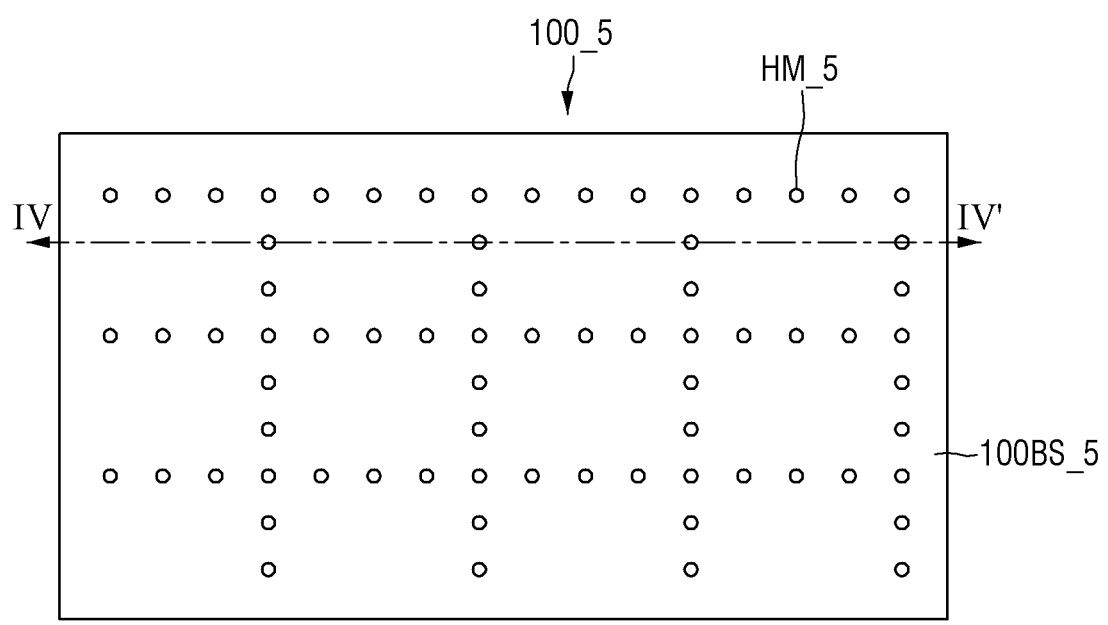
FIG. 18 is a bottom view of another embodiment of the electrostatic chuck unit shown in FIG. 1.

FIG. 18 is a bottom view of another embodiment of the electrostatic chuck unit 100_5 shown in FIG. 1.

Referring to FIG. 18, the electrostatic chuck unit 100_5 according to the illustrated embodiment is different from the embodiment of FIG. 3 in that grooves HM_5 formed on a lower surface of the electrostatic chuck unit 100_5 are shaped like circles in plan view, and the circles are spaced apart from each other.

Specifically, a plurality of grooves HM_5 may be formed on a lower surface 100BS_5 of the electrostatic chuck unit 100_5. The grooves HM_5 may have a generally circular planar shape. The grooves HM_5 may be arranged substantially parallel to each other along the first direction DR1 and the second direction DR2 in areas corresponding to the grooves HM of the embodiment of FIG. 3 and may be spaced apart from each other.

In the illustrated embodiment, since the grooves HM_5 are spaced apart from each other, a base area BA may be integrally connected. Therefore, the planar shape of the base area BA may not include an island shape. In addition, since first and second electrodes 131 and 132 are disposed in the base area BA of the electrostatic chuck unit 100_5, a connection electrode layer 140 may be unnecessary.

An example of a display device manufactured using an etching apparatus 1 according to an embodiment will now be described with reference to FIGS. 19 and 20.

Figure 19:
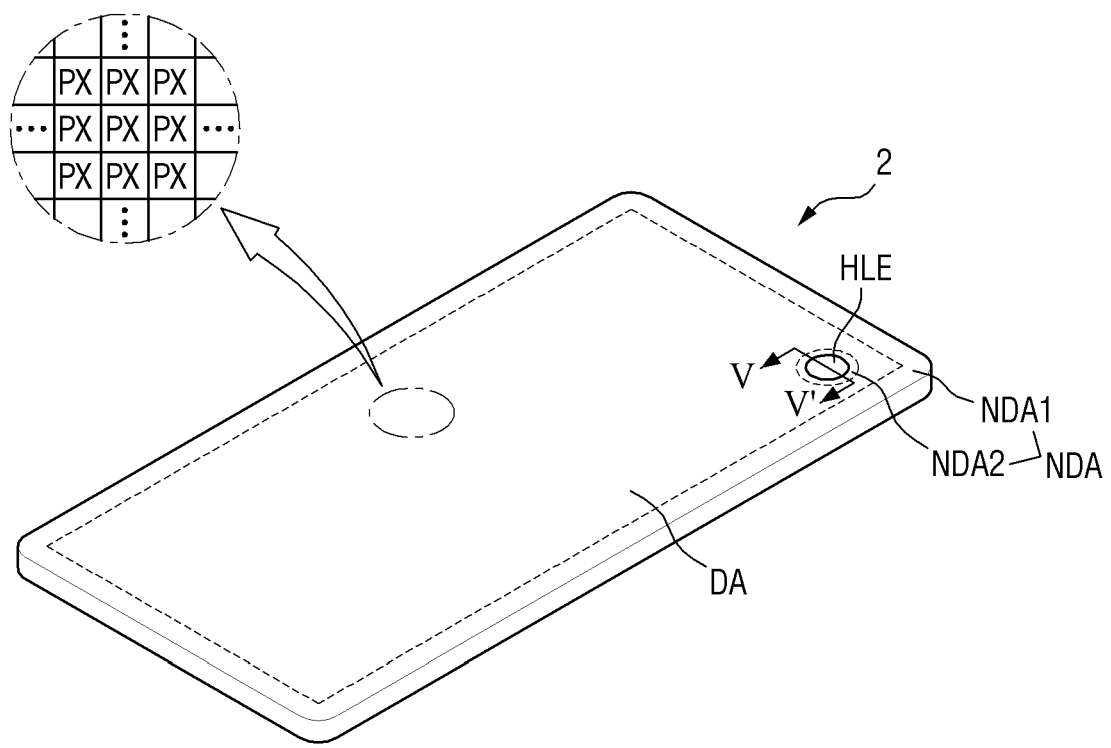
FIG. 19 is a perspective view of an embodiment of a display device constructed according to the principles of the invention.
Figure 19:
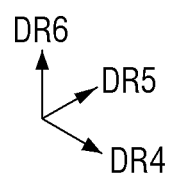

FIG. 19 is a perspective view of an embodiment of a display device 2 constructed according to the principles of the invention. FIG. 20 is a cross-sectional view taken along line V-V' of FIG. 19.

FIG. 19 illustrates an example of the display device 2 manufactured using an etching apparatus 1. The display device 2 of FIG. 19 may correspond to one unit cell CE1 or CE2 whose mother substrate is the target substrate SUB1 or SUB2 of FIG. 16 or 17.

The display device 2 may be applied to various electronic devices including small and medium-sized electronic devices such as tablet personal computers (PCs), smartphones, car navigation units, cameras, center information displays (CIDs) provided in cars, wristwatch-type electronic devices, personal digital assistants (PDAs), portable multimedia players (PMPs) and game machines and medium and large-sized electronic devices such as televisions, external billboards, monitors, PCs, and notebook computers. However, these are just examples, and it is obvious that the display device 2 can also be employed in other electronic devices without departing from the concept of the present disclosure.

The display device 2 may be take various forms according to the display method. For example, the display device 2 may be an organic light emitting display device, an inorganic electroluminescent (EL) display device, a quantum dot light emitting display device (QED), a micro-LED display device, a nano-LED display device, a plasma display panel (PDP), a field emission display device (FED), a cathode ray tube (CRT), a liquid crystal display device (LCD), an electrophoretic display device (EPD), or the like. In an embodiment, a target substrate SUB may be a substrate or a display panel of an organic light emitting display device as described above, and an organic light emitting display device will be described as an example of the display device 2. Unless particular distinction is required, an organic light emitting display device applied to the embodiment will be simply abbreviated to the display device 2.

Figure 20:
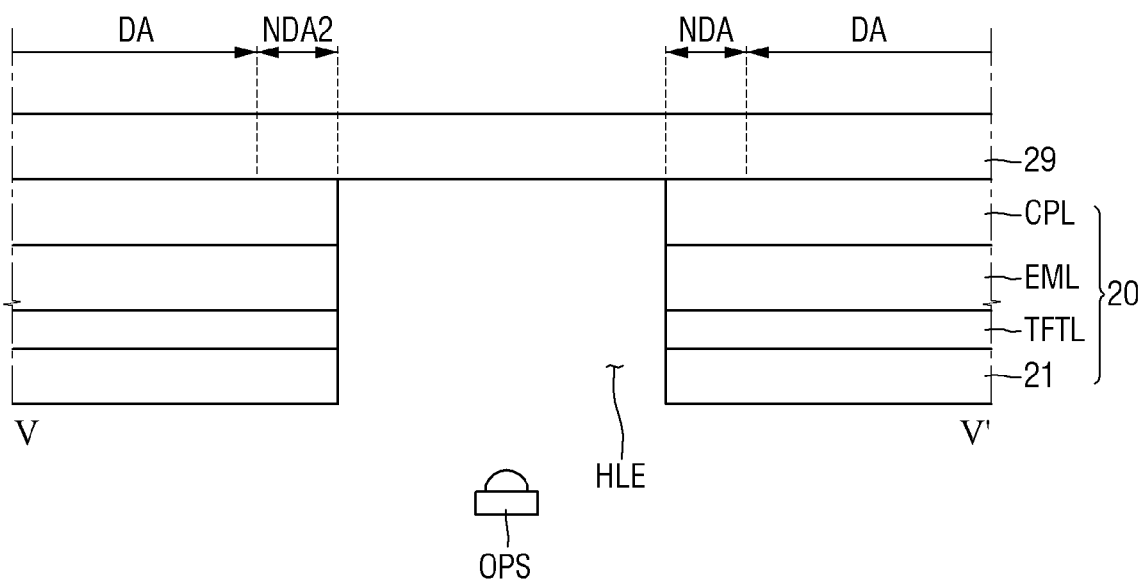
FIG. 20 is a cross-sectional view taken along line V-V' of FIG. 19.

Referring to FIGS. 19 and 20, the display device 2 may include a display panel 20 and a cover window 29 disposed on the display panel 20. The display panel 20 may include at least one hole HLE penetrating the display panel 20 in a sixth direction DR6.

In FIGS. 19 and 20, a fourth direction DR4, a fifth direction DR5, and the sixth direction DR6 are defined. The fourth direction DR4 and the fifth direction DR5 may be directions perpendicular to each other in one plane. The sixth direction DR6 may be a direction perpendicular to the plane in which the fourth direction DR4 and the fifth direction DR5 are located. The sixth direction DR6 is perpendicular to each of the fourth direction DR4 and the fifth direction DR5. In the embodiment for describing the display device 2, the sixth direction DR6 indicates the thickness direction of the display device 2.

The display device 2 may have a generally rectangular shape including long sides and short sides, that is, may be longer in the fifth direction DR5 than in the fourth direction DR4 in plan view. Corners at which the long and short sides of the display device 2 meet may be right-angled in plan view. However, the embodiments are not limited thereto, and the corners may also be rounded. The shape of the display device 2 is not limited to the above example and may also be variously changed. For example, the display device 2 may also have other planar shapes such as a square, a quadrangle with rounded corners (vertices), other polygons, and a circle.

A display surface of the display device 2 may be disposed on a side of the sixth direction DR6 which is the thickness direction. In embodiments, unless otherwise mentioned, in the description of the display device 2, "above" or "upper side" indicates the above side of the sixth direction DR6 and a display direction, and an "upper surface" indicates a surface facing the above side of the sixth direction DR6. In addition, "below" or "lower side" indicates the other side of the sixth direction DR6 and a direction opposite to the display direction, and a "lower surface" indicates a surface facing the other side of the sixth direction DR6.

The display device 2 may include a display area DA and a non-display area NDA. The display area DA may be an area where a screen can be displayed, and the non-display area NDA may be an area where no screen is displayed. The display area DA may also be referred to as an active area, and the non-display area NDA may also be referred to as an inactive area.

The shape of the display area DA may follow the shape of the display device 2. For example, the display area DA may have a generally rectangular planar shape similar to the overall shape of the display device 2. The display area DA may generally occupy the center of the display device 2.

The non-display area NDA may be defined as an area where no image is displayed. The non-display area NDA may include a first non-display area NDA1 surrounding the outside of the display area DA and a second non-display area NDA2 disposed inside the display area DA.

The first non-display area NDA1 may surround edges of the display area DA. In the first non-display area NDA1 and the second non-display area NDA2, a scan driver for transmitting scan signals to scan lines and fan-out lines connecting data lines and a driving circuit may be disposed.

The second non-display area NDA2 may be disposed in the display area DA so that it is surrounded by the display area DA. The second non-display area NDA2 may surround the hole HLE formed in the display panel 20. Parts of the scan lines and the data lines may be disposed in the second non-display area NDA2.

The display panel 20 may include a substrate 21, a circuit element layer TFTL disposed on the substrate 21, a light emitting element layer EML, and a thin-film encapsulation layer CPL. The display panel 20 may further include a sensing layer and a polarizing layer disposed on the thin-film encapsulation layer CPL.

The substrate 21, the circuit element layer TFTL, the light emitting element layer EML, and the thin-film encapsulation layer CPL included in the display panel 20 may have substantially the same structure as described in connection with the description of the cross-sectional structure of the target substrate SUB of FIGS. 7 and 8.

The second non-display area NDA2 may be formed to surround the hole HLE. The hole HLE may be formed to penetrate front and back surfaces of the substrate 21, the circuit element layer TFTL, the light emitting element layer EML and the thin-film encapsulation layer CPL of the display panel 20. That is, each of the substrate 21, the circuit element layer TFTL, the light emitting element layer EML, and the thin-film encapsulation layer CPL may include a through hole (or an opening or a hole) corresponding to the hole HLE.

Through holes of a plurality of layers of the display panel 20 may be formed in an area corresponding to the hole HLE of the display device 2 by using the etching apparatus 1. For example, (through holes of) a plurality of inorganic layers or organic layers included in the circuit element layer TFTL, the light emitting element layer EML, and the thin-film encapsulation layer CPL of the display panel 20 may be formed by irradiating a laser beam L to the area corresponding to the hole HLE using the etching apparatus 1.

After the process of etching the inorganic layers or the organic layers included in the target substrate SUB is performed using the etching apparatus 1, a through hole may be formed in the substrate 21 in the area corresponding to the hole HLE of the display device 2 through a subsequent process. For example, the through hole of the substrate 21 may be formed by performing a cutting process.

The hole HLE may have a generally circular shape in plan view. The hole HLE may have a generally cylindrical shape. However, the embodiments are not limited thereto, and the hole HLE may also have various shapes.

The cover window 29 may be disposed on the display panel 20. The cover window 29 may be disposed on the display panel 20 to completely cover the display area DA, the first non-display area NDA1, the second non-display area NDA2, and the area overlapping the hole HLE.

The display device 2 may further include an optical element OPS. The optical element OPS may be disposed in the hole HLE. Examples of the optical element OPS may include optical sensors such as a camera, a lens (a condensing lens or a light path guide lens), an infrared sensor, an iris recognition sensor, and an illuminance sensor.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A chuck for supporting a target substrate for a display device, the chuck comprising:
    a base having a first surface to support an object solely by electrostatic force and a second surface opposite the first surface, the first surface including a first area and a second area; and
    indentations formed in the second area and recessed from the first area in a thickness direction of the base, wherein the indentations include a first indentation extending in a first direction and a second indentation extending in a second direction intersecting the first direction, the indentations being configured to decrease an energy of a laser beam directed to the second area of the first surface of the chuck.

2. The chuck of claim 1, wherein the first indentation comprises a plurality of first grooves along the second direction, and the second indentation comprises a plurality of second grooves along the first direction, the first grooves and second grooves intersecting each other to form a lattice shape.

3. The chuck of claim 2, wherein a first distance between the first grooves disposed adjacent to each other in the second direction is greater than a first width of each first groove in the second direction, and a second distance between the second grooves disposed adjacent to each other in the first direction is greater than a second width of each second groove in the first direction.

4. The chuck of claim 3, wherein the first distance between the first grooves is different from the second distance between the second grooves.

5. The chuck of claim 1, wherein the chuck comprises an electrostatic chuck and the base comprises:
    a base substrate including a flat area and an indentation area having third indentation corresponding to the indentations formed in the second area;
    a first dielectric layer disposed on one surface of the base substrate;
    an electrode layer disposed on the first dielectric layer; and
    a second dielectric layer disposed on the electrode layer.

6. The chuck of claim 5, wherein the first dielectric layer, the electrode layer, and the second dielectric layer expose at least a part of the one surface of the base substrate in the indentation area.

7. The chuck of claim 6, wherein the electrode layer comprises a first electrode and a second electrode spaced apart from the first electrode, the first electrode and the second electrode being electrically insulated from each other.

8. The chuck of claim 1, wherein the indentations have an irregular geometric shape comprising at least one of a trapezoidal shape or a semi-circular shape.

9. The chuck of claim 8, wherein the depth of the indentations are in the range of 5-7 mm and the width of the indentations are in the range of 20-30 mm.

10. A chuck for supporting a target substrate for a display device, the chuck comprising:
    a base having a first surface to support an object and a second surface opposite the first surface, the first surface including a first area and a second area; and
    indentations formed in the second area and recessed from the first area in a thickness direction of the base, wherein the indentations include a first indentation extending in a first direction and a second indentation extending in a second direction intersecting the first direction,
    wherein the first indentation comprises a plurality of first grooves along the second direction, and the second indentation comprises a plurality of second grooves along the first direction, the first grooves and second grooves intersecting each other to form at least one closed loop.

11. The chuck of claim 10, wherein the chuck comprises an electrostatic chuck and the base comprises:
    a base substrate including a flat area and an indentation area having third indentation corresponding to the indentations formed in the second area;
    a first dielectric layer disposed on one surface of the base substrate;
    an electrode layer disposed on the first dielectric layer; and
    a second dielectric layer disposed on the electrode layer.

12. The chuck of claim 11, wherein the first dielectric layer, the electrode layer, and the second dielectric layer expose at least a part of the one surface of the base substrate in the indentation area.

13. The chuck of claim 12, wherein the electrode layer comprises a first electrode and a second electrode spaced apart from the first electrode, the first electrode and the second electrode being electrically insulated from each other.

14. A chuck for supporting a target substrate for a display device, the chuck comprising:
   a base having a first surface to support an object and a second surface opposite the first surface, the first surface including a first area and a second area; and
   indentations formed in the second area and recessed from the first area in a thickness direction of the base, wherein the indentations include a first indentation extending in a first direction and a second indentation extending in a second direction intersecting the first direction,
   wherein base comprises:
   a base substrate including a flat area and an indentation area having third indentation corresponding to the indentations formed in the second area;
   a plurality of first electrodes on the base substrate; and
   at least one connecting electrode connecting at least two or more of the first electrodes;
   wherein the plurality of first electrodes are disposed in the first area and do not overlap the second area and
   the connecting electrode is disposed in the second area.

15. The chuck of claim 14, wherein the connecting electrode is further disposed in the first area.

16. The chuck of claim 15, wherein the connecting electrode overlaps and contacts adjacent the first electrodes in the first area.

\* \* \* \* \*